United States Patent [19]
Abbey

[11] Patent Number: 6,061,008
[45] Date of Patent: May 9, 2000

[54] SIGMA-DELTA-SIGMA MODULATOR FOR HIGH PERFORMANCE ANALOG-TO-DIGITAL AND DIGITAL-TO-ANALOG CONVERSION

[75] Inventor: Duane L. Abbey, Cedar Rapids, Iowa

[73] Assignee: Rockwell Science Center, Inc., Thousand Oaks, Calif.

[21] Appl. No.: 08/994,729

[22] Filed: Dec. 19, 1997

[51] Int. Cl.[7] .................................................. H03M 3/02
[52] U.S. Cl. ........................................... 341/143; 341/144
[58] Field of Search ..................................... 341/143, 155, 341/144

[56] References Cited

U.S. PATENT DOCUMENTS

| | | | |
|---|---|---|---|
| 5,274,375 | 12/1993 | Thompson | 341/143 |
| 5,345,233 | 9/1994 | Nagata et al. | 341/176 |
| 5,623,263 | 4/1997 | Kuo et al. | 341/143 |
| 5,648,779 | 7/1997 | Cabler | 341/143 |
| 5,654,711 | 8/1997 | Fyjimori | 341/143 |
| 5,682,161 | 10/1997 | Ribner et al. | 341/143 |
| 5,742,246 | 4/1998 | Kuo et al. | 341/143 |
| 5,757,301 | 5/1998 | Kuo et al. | 341/143 |

*Primary Examiner*—Howard L. Williams
*Assistant Examiner*—Peguy Jean Pierre
*Attorney, Agent, or Firm*—Kyle Eppele; James P. O'Shaughnessy

[57] ABSTRACT

A sigma-delta-sigma modulator for analog-to-digital and digital-to-analog converters is described. The sigma-delta-sigma modulator is amenable to fabrication of high speed LSI and VLSI digital components for fixed and programmable processes for minimizing and eliminating required analog circuitry in a digital radio. The sigma-delta-sigma modulator is utilized in a direct sampling receiver in which the received RF is converted by high resolution analog-to-digital processing and subsequently translated to baseband, filtered and demodulated completely in the digital domain. The modulator is also utilized in a direct digital transmitter in which the baseband modulation is formed, translated to RF, and converted to analog by high resolution digital-to-analog processing completely in the digital domain.

66 Claims, 21 Drawing Sheets

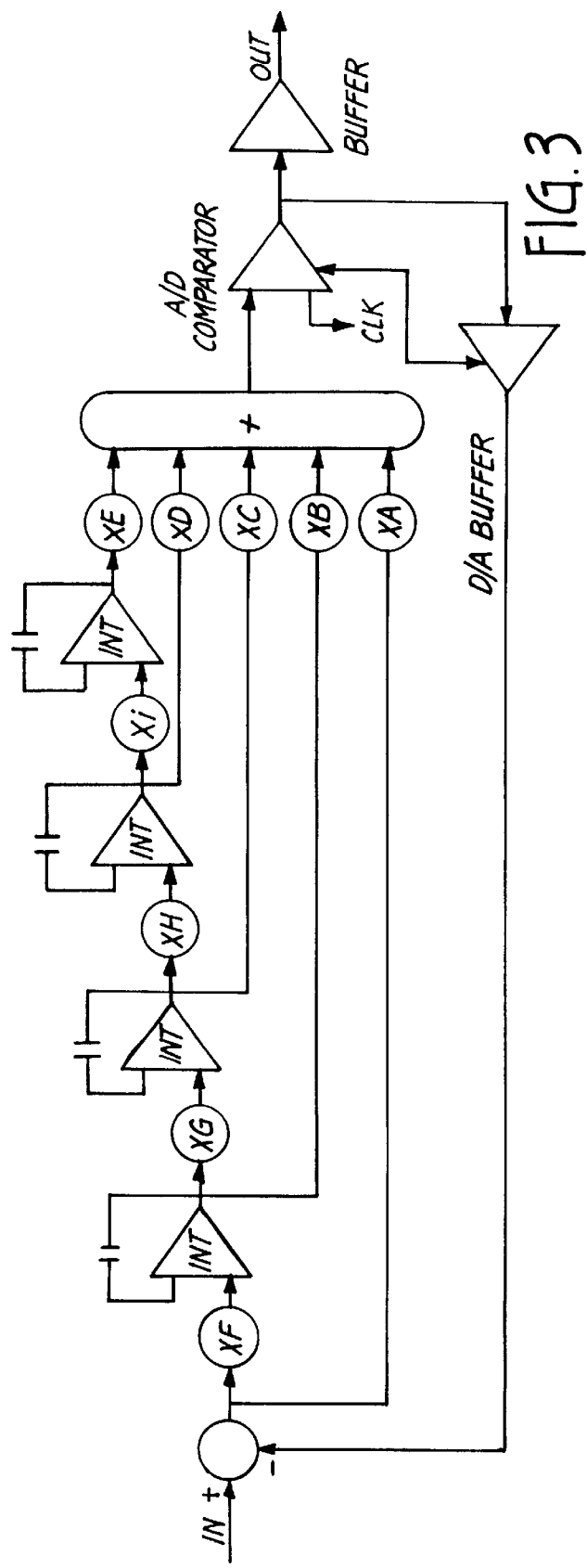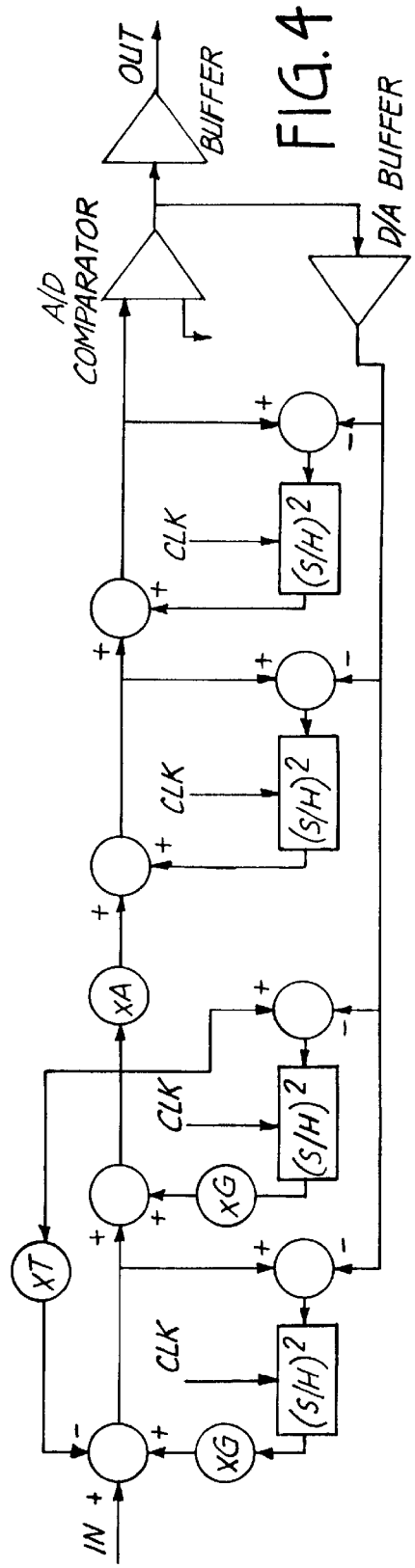

SIGMA-DELTA-SIGMA MODULATOR FOR HIGH PERFORMANCE ANALOG-TO-DIGITAL AND DIGITAL-TO-ANALOG CONVERSION

BACKGROUND OF THE INVENTION

The present invention generally relates to the field of digital radios, and more particularly a sigma-delta-sigma modulator for analog-to-digital and digital-to-analog conversion in digital radios.

Current analog-to-digital and digital-to-analog conversion technology has spurious free dynamic ranges equivalent to 4 to 8 bits in the HF/VHF/UHF band. Required are 14 to 18 bits of performance to make digital signal processing directly at RF a reality. Additionally, there are numerous applications for ultra wide bandwidth, high resolution converters other than digital radios. There lies a need for high performance analog-to-digital (A/D) and digital-to-analog (D/A) converters for utilization in direct sampling digital receivers and direct digital transmitters.

As military budgets decline, there is an urgent need for communications equipment with greater flexibility that will support multiple modes of operation, signal bandwidths and waveforms while maintaining low cost, small size and high reliability. Additionally it is desirable to provide the capability to upgrade existing equipment for new requirements as they arise. The use of digital signal processing (DSP) techniques running under software control are therefore highly desirable, if not mandatory, to replace the analog circuits in communications equipment. Maximum use of DSP will support the inclusion of additional capabilities, provide greater flexibility, facilitate use of common modules, and provide more effective built-in-test (BIT). Digital techniques are also compatible with large scale integration (LSI) and very large scale integration (VLSI) technology, ensuring that continued improvements will result in size, cost and reliability.

SUMMARY OF THE INVENTION

Accordingly, it is a goal of the present invention to provide increased flexibility required in the next generation of digital radios while improving signal reception and performance thereof. In order to provide the increased flexibility, communications equipment must evolve to a completely digitally processed signal generation and recovery system supporting multiple modes, bands, modulation and demodulation techniques, speech processing, data recovery, ECCM, surveillance, and noise and interference reduction. The sigma-delta-sigma modulator of the present invention is amenable to fabrication of high speed LSI and VLSI digital parts, both fixed process and programmable, to minimize the analog circuitry required.

A primary objective of the present invention is to develop techniques for a direct sampling receiver (DSR) in which the received RF is converted by high resolution analog-to-digital (A/D) processing and subsequently translated to baseband, filtered and demodulated completely in the digital domain. The baseband part of the radio system comprises a digital signal processor array (or single DSP where processing requirements are limited) and support user input/output (I/O) interface, configured for dynamic reallocation of processing bandwidth as signal traffic requires. The transmit side of the radio system comprises a direct digital transmitter (DDT) in which the digitally synthesized RF signal is converted by high resolution digital-to-analog processing and directly amplified for transmission.

Processing RF signals on frequency in the digital domain is amenable for small, high performance and highly programmable receivers but currently presents formidable challenges. Such receivers can require from 14 to 20 bits of resolution at sample rates 2.5 to 3 times the RF signal bandwidth and even higher effective bits of linearity. If the noise suppression and linearity are not adequate, the receiver's multi-signal dynamic range is reduced. Such a loss in performance is generally only recovered by using narrow tunable preselection filters to isolate received signals prior to A/D conversion. Some environments, especially at HF (up to 30 MHz), have signal densities and level differences that effectively preclude isolation by analog preselection under all conditions. It is therefore a goal of the present invention to define A/D and D/A converter architectures that meet and exceed these performance levels.

It is to be understood that both the foregoing general description and the following detailed description are exemplary and explanatory only and are not restrictive of the invention as claimed.

The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which:

FIG. 3 is a diagram of a four stage delta-sigma analog-to-digital converter modulator;

FIG. 4 is a diagram of a four stage sigma-delta-sigma analog-to-digital converter modulator;

DESCRIPTION OF THE PREFERRED EMBODIMENT

Reference will now be made in detail to the presently preferred embodiment of the invention, examples of which is illustrated in the accompanying drawings.

Figure 1:
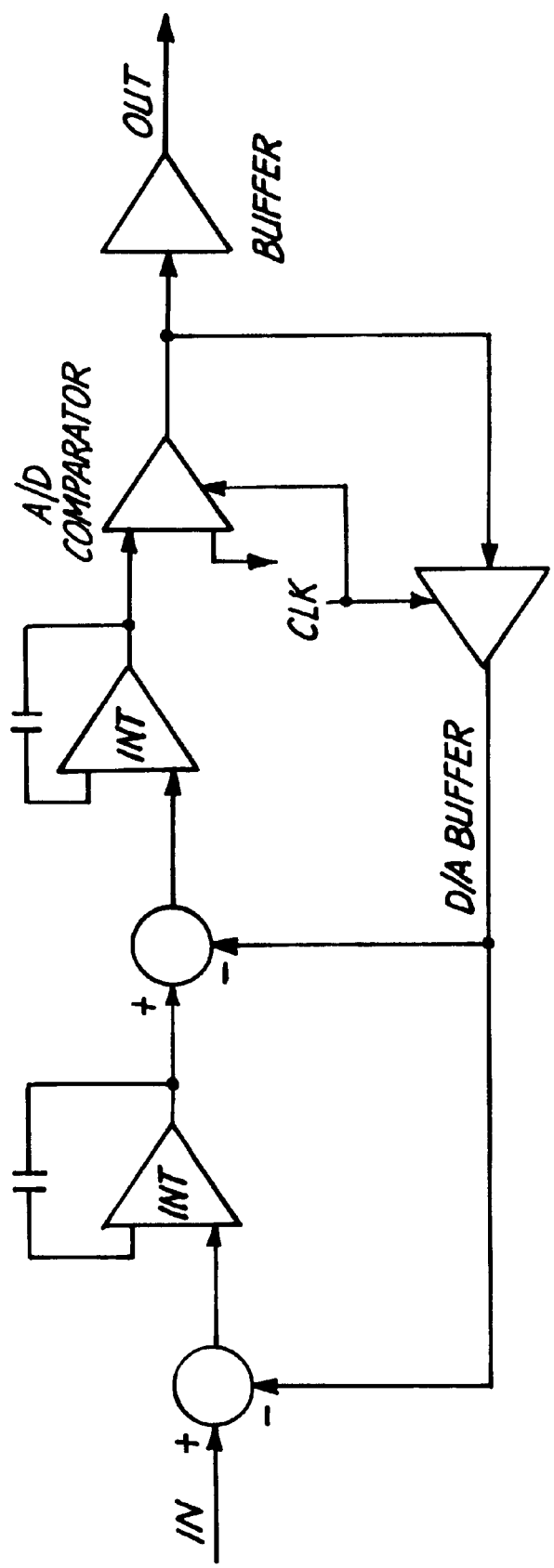
FIG. 1 is a diagram of a two stage delta-sigma analog-to-digital converter modulator.

Referring now to FIG. 1, a diagram of a two stage delta-sigma analog-to-digital converter modulator is shown. The present invention utilizes 1-bit output sigma-delta modulators suitable for implementation in high speed heterojunction bipolar transistor (HBT) and metal semiconductor field effect transistor (MESFET) arrays. A basic two stage delta-sigma modulator design is shown. Each stage comprises a differentiator (delta function) in which the one bit digital output signal is subtracted from the input signal, followed by an integrator (sigma function). Since the output quantization noise and distortion of the modulator does not get differentiated, only integrated, the stage can provide a flat signal response and at the same time roll off the noise and distortion as the frequency decreases. This is because the phase inversion on noise and distortion around the modulator loops converts integrated noise and distortion to differentiated noise and distortion at the comparator output. A two or more stage modulator does a much better job of distortion suppression than a single stage modulator and provides additional roll off of noise and distortion with each added stage. However, two or more stages are not inherently stable because of the output phase shift back around the loop.

In order to stabilize higher order loops, additional means must be incorporated to control loop gain such that variations in input signal gain and frequency do not force the modulator into a very low performance state known as limit cycles. During limit cycle conditions, the integrators operate mostly saturated and lose their ability to suppress noise and distortion. These stability control means result in reduced noise and distortion suppression from the theoretical (each additional stage provides less than incremental performance improvement). The theoretical noise suppression per stage n is $(1-z^{-1})^n$ where $z^{-1}$ is equivalent to $e^{-j\omega T}$, $\omega$ being the frequency response in radians per second and T being the output data bit period in seconds.

Figure 2:
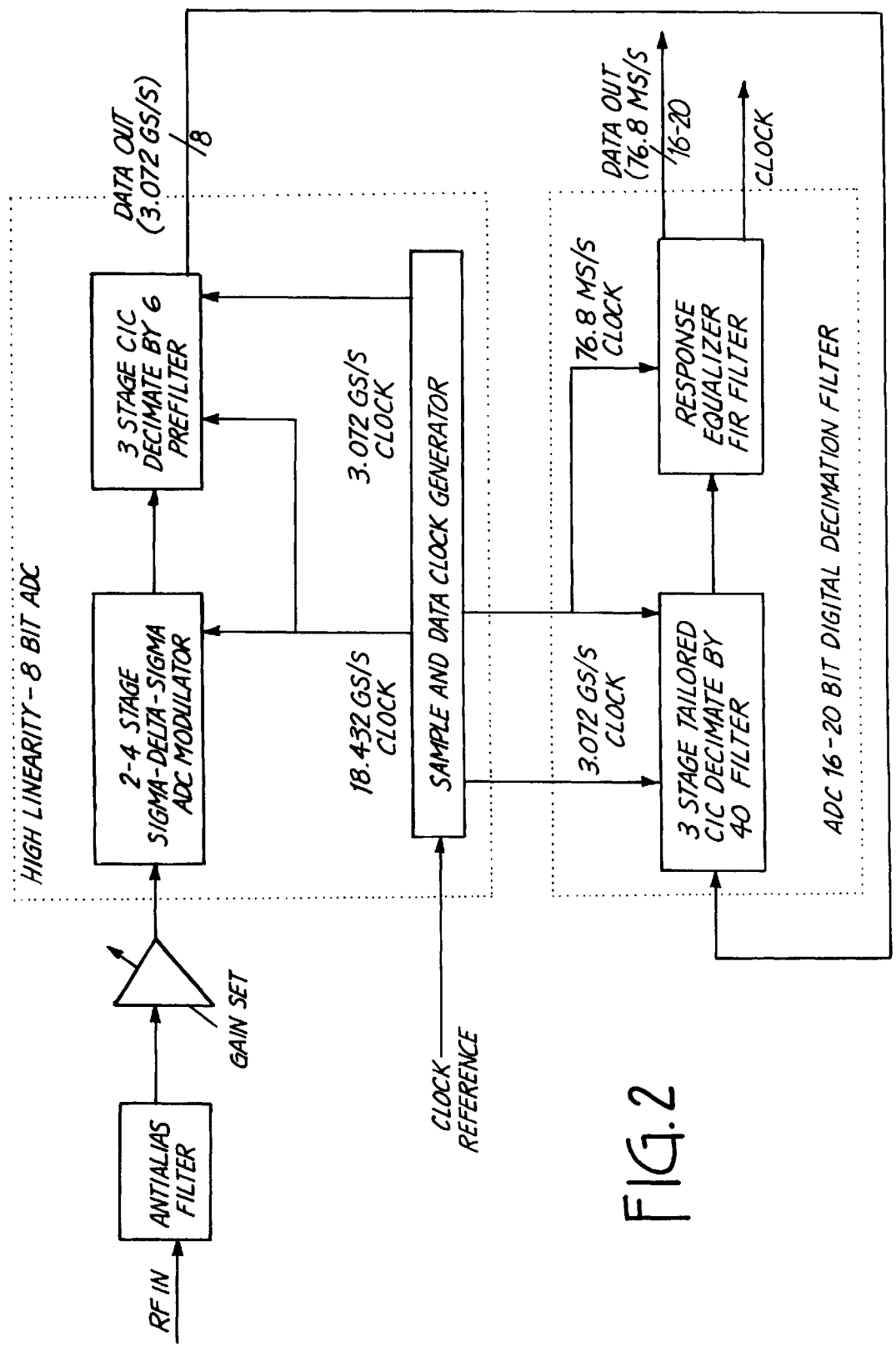
FIG. 2 is a block diagram of a high frequency band analog-to-digital converter.

Referring now to FIG. 2, a block diagram of a high frequency band analog-to-digital converter is shown. The A/D converter architecture provides access to both an 8-bit and a nominal 18-bit decimated A/D output. First, there is a highly linear 1-bit AND converter part, with an 8-bit decimated output, utilizing HBT/MESFET technology and supporting a 100 MHz bandwidth at 3.072 GS/s. The design is based upon a single bit output sigma-delta-sigma (SDS) modulator clocked at 18.432 GS/s. There is a 3 stage cascaded-integrator-comb (CIC) decimate-by-6 filter to produce the 8-bit output. The 8-bit output is processed further to a nominal 18-bit output by the digital decimation filter utilizing digital FET gate array/standard cell technology and supporting a 30 MHz bandwidth at 76.8 MS/s. The filter comprises a 3-stage CIC decimate-by-40 filter, utilizing a tailored comb frequency placement and a 30 MHz corner resonator. A short (8- to 20-tap) finite impulse response (FIR) filter is provided to equalize the amplitude of the 30 MHz output bandwidth. A high quality anti-alias filter is utilized with the A/D converter to reduce the chances of modulator overload as well as to minimize the amount of out-of-band energy that can contribute to in-band noise and distortion, both in the modulator and in the decimation filters. Since 18 GS/s sample clock rates with today's technology presents a formidable challenge, various modulator architectures and means of reduce the sample clock rate needed to be conceived and evaluated by computer simulation.

The modulator architectures were designed and evaluated using PSPICE based analog behavioral model simulation, i.e. designs implemented using voltage controlled voltage and current sources, resistors, capacitors, and sinusoidal and pulsed signal sources. Numerous architectural variations, most of which utilized a single bit output, to maintain high linearity in the decimated output, were postulated and evaluated by simulation. Early on, single and dual stage architectures were evaluated that used low-pass filters rather than integrators in the forward feed path of each stage. Filters with 2 through eight poles per stage and 30 MHz through 800 MHz bandwidth were evaluated. The approach was found to support in-band noise suppression, but provided only marginal intermodulation and harmonic distortion suppression. Further, the approach created a pseudorandom carrier resonance in frequency above the filter bandwidth. The carrier resonance could combine with the input signal to produce in-band distortion products. Noise dither was used to try to improve the distortion, again with marginal improvement (<10 dB), and the noise performance was degraded as a result, even when different means to cancel the added noise were implemented. The best distortion suppression was achieved by making the filter bandwidth much wider than the desired bandwidth, resulting in a much higher frequency carrier resonance and less distortion product energy falling in the desired bandwidth. However, the wide filter bandwidth had poor noise performance compared to the signal matched filter bandwidths.

Efforts then turned to using simulated analog integrators in variations of the classical architectures such as shown in FIG. 1. Integrator based modulators provide better harmonic and intermodulation distortion suppression than do bandpass filter modulators since noise and distortion are filtered across the signal bandwidth, not just above it. Further, as long as the number of stages is two or more, no discernible out-of-band resonance carrier is formed (approaches white noise) to cause added in-band intermodulation distortion. The drawback is that modulators with more than two stages must be stabilized by techniques that diminish the per stage in band noise and distortion suppression such as shown in FIG. 3. Nonetheless, increased order modulators seem to be required to attempt to get the desired A/D converter performance. Both multistage inline and cascaded architectures were postulated and evaluated. The cascaded architectures, sometimes known as MASH configurations, were based mainly on two cascaded 2-stage modulators or a 2-stage modulator cascaded with a 1-stage modulator in which the residual noise from the first modulator is formed by comparing the output to either the input to the quantizer or alternatively to the modulator signal input (both tried). This detected noise is used as the input to the second modulator, the output of which is digitally subtracted from the first modulator's digital output, thereby reducing the noise further in the first modulator's output. The second stage digitized output must be multiplied by $(1-z^{-1})^2$ prior to subtraction (double differentiation) to compensate for the two integrations in the first modulator. In either case, it was found that it was very difficult to effectively cancel noise and distortion over a wide bandwidth and produce a high spurious free dynamic range. In exact matching between the first modulator's dual integration response and the second modulator's dual differentiation response, as well as in exact noise determination from the first modulator as input to the second modulator, resulted in the second modulator adding little overall to the first modulator's performance. Because of this, anytime the mismatches are greater than zero, the output noise performance degrades and typically by 1% mismatch, the output noise is totally dominated by the first modulator output.

Inline modulators comprising 4, 6 and 8 stages (3.072 GS/s) were evaluated and showed that in order to stabilize the modulators as well as limit the input signal voltage growth, 4 to 6 stages is a good practical limit for 1 bit modulators. In order to support wideband noise suppression, the oversampling rate $(F_s/[2B_w])$ must be sufficiently high when coupled with suppression bandwidth noise redistribution means or the desired performance level cannot be achieved. Suppression bandwidth noise redistribution means are used in low pass delta-sigma modulators to recover part of the excess performance at low frequencies to enhance the performance at high frequencies in the signal passband. It was found that such means could flatten the noise response across the signal bandwidth but provided only marginal improvement in noise performance at higher passband frequencies. The most direct way to improve noise and distortion suppression performance when possible is to increase the oversampling ratio. Since the analog integrators are required to have very low leakage for high performance modulators, their open loop voltage gain must be as high as possible (gain>1000). Current HBT feature sizes and materials have unity gain bandwidths of 50 GHz or slightly more, which means that the integrators can only support maximum sample rates of about 3 to 4 GS/s. In addition, for the modulator to optimally suppress noise across the signal bandwidth without distorting the signal's frequency response, the 'delta function' differentiation frequency response $(1-z^{-1})$ must be matched to and exactly offset the 'sigma function' integration frequency response $(1/[1-z^{-1}])$. To satisfy these requirements, as well as increase stability, and thereby attempt to achieve the desired A/D performance, the sigma-delta-sigma (SDS) modulator of the present invention was conceived.

Referring now to FIG. 3, a diagram of a four stage delta-sigma analog-to-digital converter modulator is shown. The delta-sigma modulator has single bit output data at 3.2 GS/s and four integrators in cascade. The modulator is based on a multistage modulator described by C. Sodini et al. in *IEEE Transactions in Circuits and Systems*, March 1990. The modulator uses forward-feed signal bypasses and signal attenuation between integrators to stabilize and maintain linear integration, as well as to widen the noise suppression bandwidth. In contrast, the modulator design of the present invention maintains the single delta-sigma per stage relationship for an ideal flat signal response (i.e., 1 feedback per integrator).

For reasons of the final I and Q output flexibility in programmable data rate and bandwidth, the example A/D conversion process needs to support 76.8 MS/s output at 16 to 20 bits of resolution and a 30 MHz bandwidth. This suggests that the modulator clock needs to be a multiple of 76.8 MHz. Preferred clock rates are 3.072 GS/s, 9.216 GS/s and 18.432 GS/s. Since the current HBT process has a unity gain bandwidth of slightly over 50 GHz, and the integrators require a minimum of 60 dB open loop voltage gain to minimize leakage effects for high performance, 1 GS/s is about the fastest the modulator can be clocked using integrators. However, using an architecture that does not use analog integrators, the clock rate becomes limited mainly by the digital processing speed of the HBT circuits.

Referring now to FIG. 4, a diagram of a four stage sigma-delta-sigma analog-to-digital converter modulator is shown. FIG. 4 shows a stabilized four stage SDS modulator comprising a basic two stage modulator (right most two stages prior to the comparator) preceded by a two stage resonator to stabilize the modulators as well as limit the signal level growth without excessive performance loss. By placing the stabilizing resonator as the first two stages rather than the last two stages, the signal passband retains a flat response with respect to frequency. What makes this architecture unique is the lack of analog integrators coupled with perfectly matched delta function and sigma function responses. Looking at a single stage, a signal is input through a sigma function (input summer). The summer output passes through a delta function (modulator output fed back and subtracted). The error signal (difference between the input signal and the output signal) is passed through a clocked dual sample and hold function (S/H²). The dual sample and hold provides identically the same $z^{-1}$ delay and functional frequency response to the sigma function and the delta function. The delayed output is fed back to the sigma function summer to complete the SDS stage. The summers used are unity gain without the same sampling frequency rate limitations found in the analog integrators. The sample and hold has to have both voltage and current gain during the sample part of the clock cycle to faithfully respond to the delta function input, however, minimal gain is required during the hold part of the clock cycle, which is the important part of the cycle for low signal loss and distortion.

The dual sample and hold delay element losses need to be minimized for optimum modulator performance. However, any dual sample and hold loss does not affect the sigma-delta function frequency response balance and the absolute random errors tend to average out over time. Even though the SDS modulator does not use integrators, it has the same ideal transfer function as a four stage modulator configured with analog integrators. In addition, the dual sampled and held delay elements allow for increased modulator stability over continuous integrator based modulators, resulting in less modulator loss and greater input dynamic range.

The behavioral simulation of the four stage SDS modulator utilized a 3.072 GS/s clock and an input signal comprised of two equal tones at 7 MHz and 12 MHz. The 30 MHz bandwidth S/N density ratio is 142.8 dBc-Hz relative to the +6 dB composite input signal. There is no discernible distortion above the noise, i.e., any distortion products are at least -76 dBc (composite signal). Comparing the 142.8 dBc-Hz performance with the ideal (196.6 dBc-Hz), there are over 50 dB of implementation, stabilization, and signal growth prevention losses. The sample and hold behavioral model losses were less than 1%. The potential for some additional performance improvement at the higher frequencies of the passband probably still exists, but the 3 GS/s clock rate is probably not going to achieve the additional 20 dB or more required. Therefore, the sample clock rate was increased by a factor of 6 to 18.432 GS/s, and a two stage SDS modulator (last two stages of FIG. 4) was simulated. The 172.5 dBc-Hz noise performance from just a 2-stage modulator exceeds by over 10 dB the minimum requirements of the A/D converter and is within 15 dB of the ideal. The simulation results were limited in resolution by a currently maximum available FFT algorithm of 16 k points and the required windowing function for noise leakage suppression. In order to somewhat compensate, the two input tones were separated further to 5 MHz and 13 MHz. Even so, the third order intermodulation distortion product (21 MHz) is -96 dBc (composite signal). This very low level of distortion can still be too high in some multiple high-level interfering tone situations, when the desired signal is very low level. Therefore, more than two stages may be desired, such as 4 to 6 stages and at 9 GS/s, to allow for longer signal settle times. It currently does not appear that traditional delta-sigma modulator architectures can meet the high dynamic range and wide bandwidth A/D requirements. However, it does appear that the SDS architecture running at higher sample clock rates will meet the A/D performance requirements. Further, next generation HBT parts, with $F_T$>100 GHz, will support the 9 GS/s sample rate.

Figure 5:
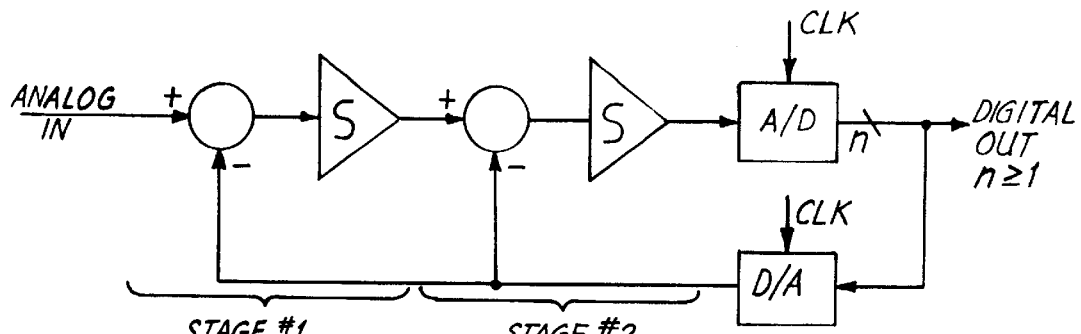
FIG. 5 is a diagram of a two stage delta-sigma modulator analog-to-digital converter.

Referring now to FIG. 5, a diagram of a two stage delta-sigma modulator analog-to-digital converter is shown. The input (x) is passed through two subtractors ($1-z^{-1}$ delta functions) and two integrators ($1/(1-z^{-1})$ sigma functions) before quantizing (A/D) where noise and distortion is added (Q) to form the (Y) output. Both Q and x are filtered by the integrators. Only x is filtered by the differentiator (delta function subtractor). In this way x is passed to Y as long as the integrator's transfer function exactly offsets the differentiator's transfer function. Any non-offsetting difference in the delta-sigma transfer function produces distortion on x and reduces the noise suppression potential. The integrators are typically analog (1/s) circuits with leakage and less than desired transfer function repeatability.

Figure 6:
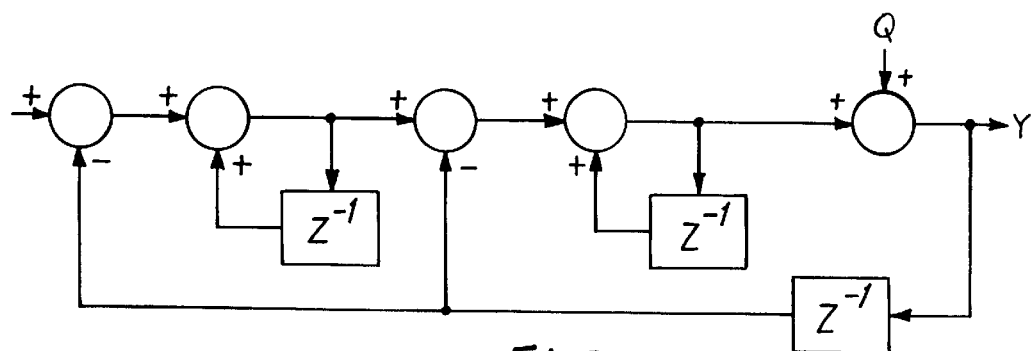
FIG. 6 is a linearized flow diagram of a z-domain model of the modulator analog-to-digital converter of FIG. 5.

Referring now to FIG. 6, a linearized flow diagram of a z-domain model of the modulator analog-to-digital converter of FIG. 5 is shown. The integrator ($1/(1-z^{-1})$) transfer function does not match the analog integrator's transfer response adequately for high performance modulators. Even if the bilineal transform is used to shape the integrator function to better match the ($1/(1-z^{-1})$) transfer function, integrator leakage, greater required less for stability, and less than desired transfer function repeatability will degrade modulator performance. The analog integrator function transformation, based on the bilineal transform, between the s- and the z-domains is:

$1/(1-Gz^{-1})=(2+ST)/[2(1-G)+ST(1+G)]$ where G is the integrator leakage factor and T is the sample clock period.

Figure 7:
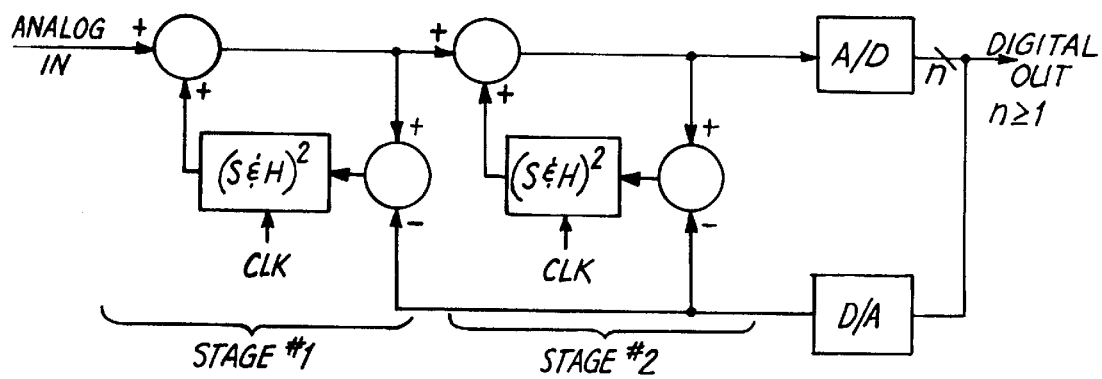
FIG. 7 is a diagram of a two stage sigma-delta-sigma modulator analog-to-digital converter in accordance with the present invention.
Figure 8:
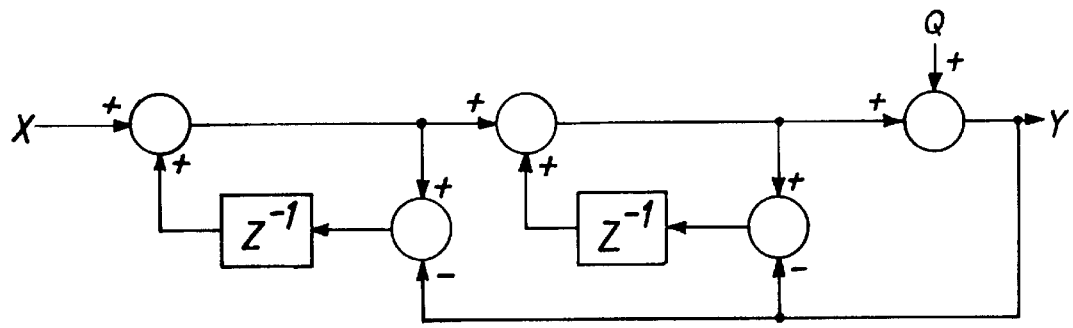
FIG. 8 is a linearized flow diagram of the z-domain model of the modulator analog-to-digital converter shown in FIG. 7.

Referring now to FIGS. 7 and 8, a diagram of a two stage sigma-delta-sigma modulator analog-to-digital converter in accordance with the present invention and a linearized flow diagram of the z-domain model of the modulator analog-to-digital converter of FIG. 7 are shown. The input (x) is passed directly to the quantizer (A/D) where noise and distortion (Q) is added to form (Y) output. Q is filtered and suppressed across the signal bandwidth but x is not filtered. Since each stage has a common delay element between the digital integration ($1/(1-z^{-1})$) transfer function and the digital differentiation ($1-z^{-1}$) transfer function the signal x has a net flat response, i.e. $(1-z^{-1})/(1-z^{-1})=1$. The noise and distortion Q, on the other hand, is only from the digital output via (D/A) feedback buffer resulting in a net differentiation response from each stage. Because common dual sample and hold delay elements are used, there is automatically no transfer function mismatch losses, nor are there any analog integrator leakage performance losses. Even with some dual sample and hold performance degradation, the effect is on the noise and distortion suppression, not directly on the input signal x. The dual sample and hold stages do not require as much gain as analog integrator stages. Therefore, sample rates can be increased beyond that for analog integrator based modulators, resulting in greater noise and distortion suppression over wider signal bandwidths. Further, since the sampled signal in each integrator loop is effectively just the noise and not the signal plus noise, higher input signal levels can be used for stable operation.

Figure 9:
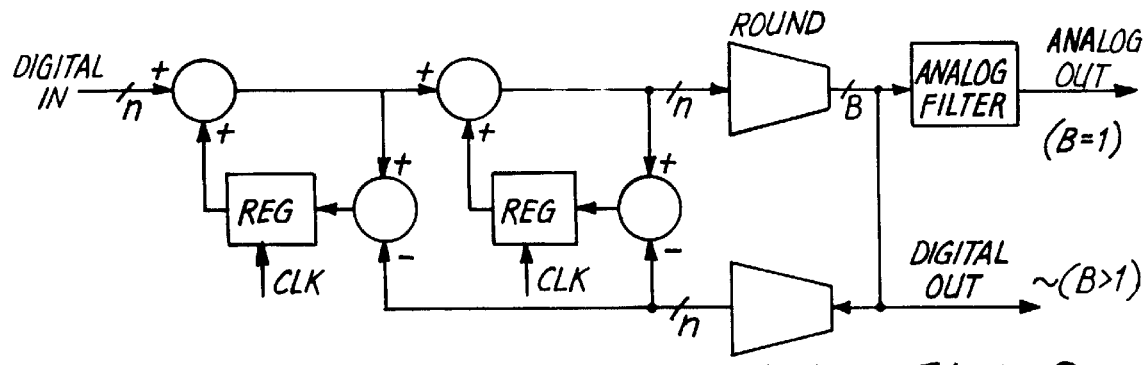
FIG. 9 is a diagram of a two stage sigma-delta-sigma digital-to-analog converter in accordance with the present invention.

Referring now to FIG. 9, a diagram of a two stage sigma-delta-sigma digital-to-analog converter in accordance with the present invention is shown. If the round function produces a digital output of B bits where n>B>1, then the B bit output can be used as a digital resolution compressor. The noise and distortion produced by the rounding (or truncation) process is shaped to suppress low frequency noise and move it to a higher frequency band, above the desired signal bandwidth.

As with any noise shaping modulator, the modulator sample rate must be much higher than the desired signal bandwidth. Therefore, there is usually an interpolation pre-filter that produces the oversampled digital input to the sigma-delta-sigma modulator.

Figure 10:
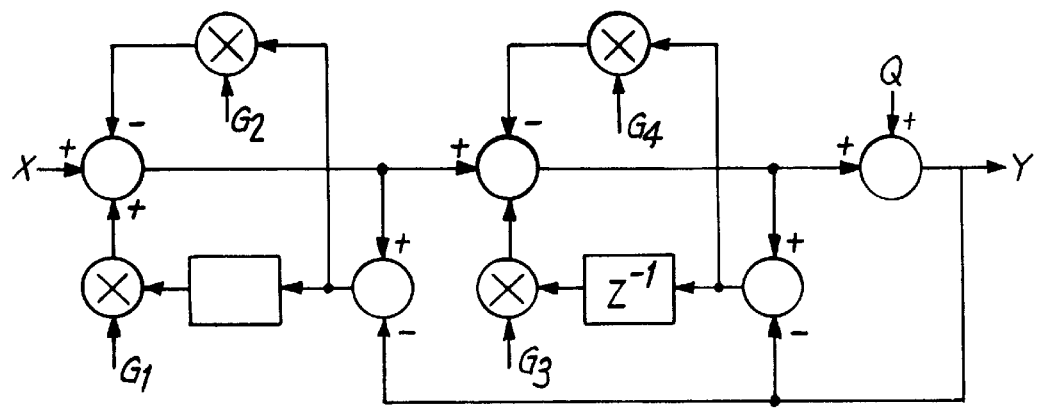
FIG. 10 is a linearized flow diagram showing the gain variations of a two stage sigma-delta-sigma modulator in accordance with the present invention.

Referring now to FIG. 10, a linearized flow diagram illustrating the gain variations of a two stage sigma-delta-sigma modulator in accordance with the present invention is shown.

$$Y=x+Q(1+G_2-G_1z^{-1})(1+G_4-G_3z^{-1})$$

$$Y=x+Q\ \pi|[i=1,m](1+G_{2i}-G_{2i-1}z^{-1})$$

where m is the number of stages.

Figure 11:
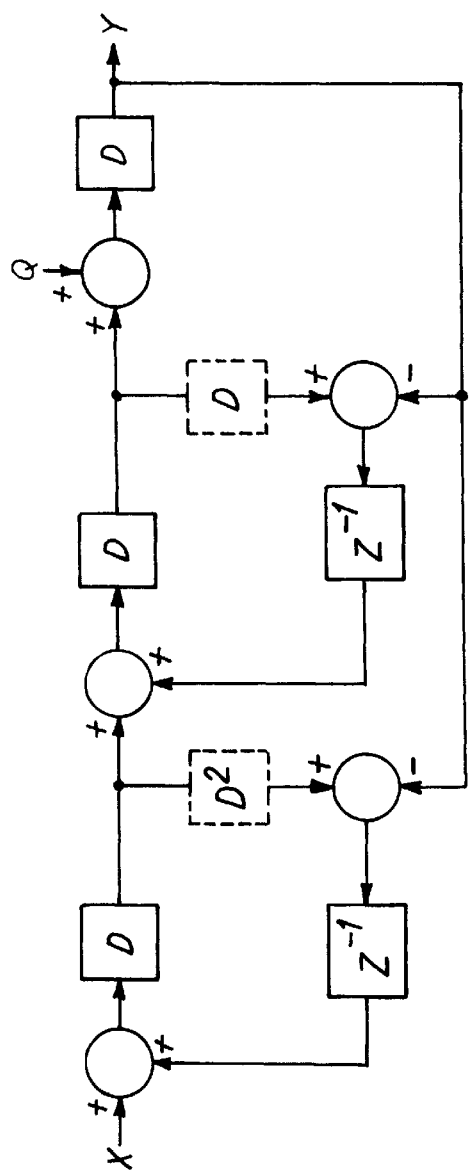
FIG. 11 is a linearized flow diagram showing the delay compensation of a two stage sigma-delta-sigma modulator in accordance with the present invention.

Referring now to FIG. 11, a linearized flow diagram showing the delay compensation of a two stage sigma-delta-sigma modulator in accordance with the present invention is shown. Assume $z^{-1}$ delay includes subtractor delay.

$$Y=D^3x+DQ(1-D^2z^{-1})(1-D^3z^{-1})$$

$$Y=D^{m+1}x+DQ(1-D^2z^{-1})(1-D^3z^{-1})\ldots(1-D^{m+1}z^{-1})$$

where m is the number of stages. Forward loop delays for x are balanced to feedback loop delays. $D^xz^{-1}$ response is equivalent to slightly lower sample rate, where $D^xz^{-1}=X$ times the delay 'D'+$z^{-1}$ delay.

Figure 12:
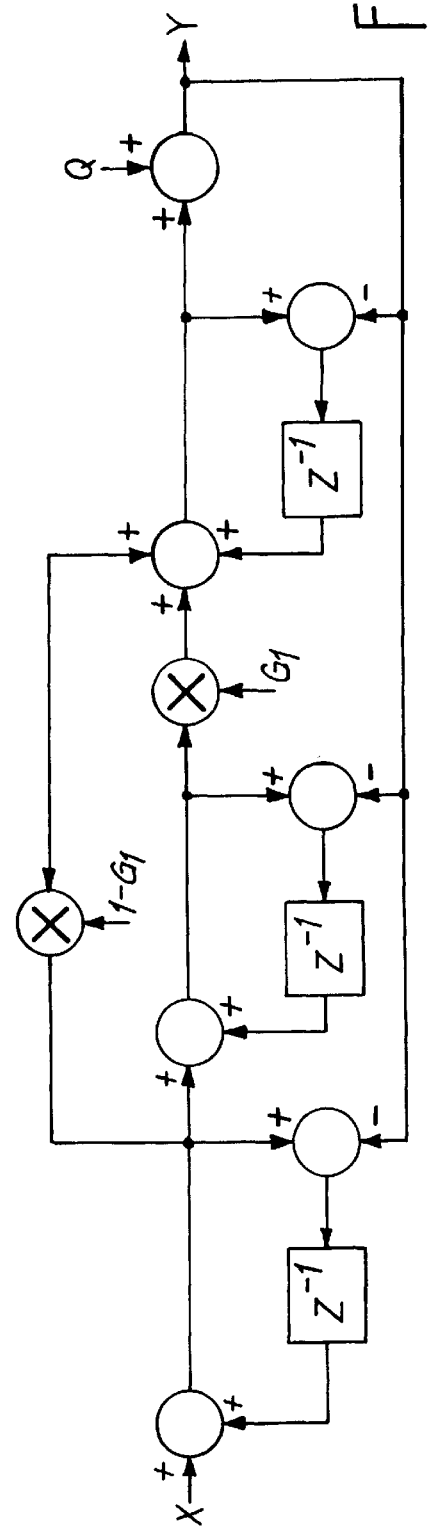
FIG. 12 is a linearized flow diagram of a three stage sigma-delta-sigma modulator of the present invention having feed forward stabilization.

Referring now to FIG. 12, a linearized flow diagram of a three stage sigma-delta-sigma modulator of the present invention having feed forward stabilization is shown.

$$Y=x+[Q(1-z^{-1})^3/(1-z^{-1}(1-G_1))]$$

Modulators with more than two stages require stabilization measures. This method produces a flat response to x, the noise suppression of>2 stages and the spurious suppression of approximately three stages.

Figure 13:
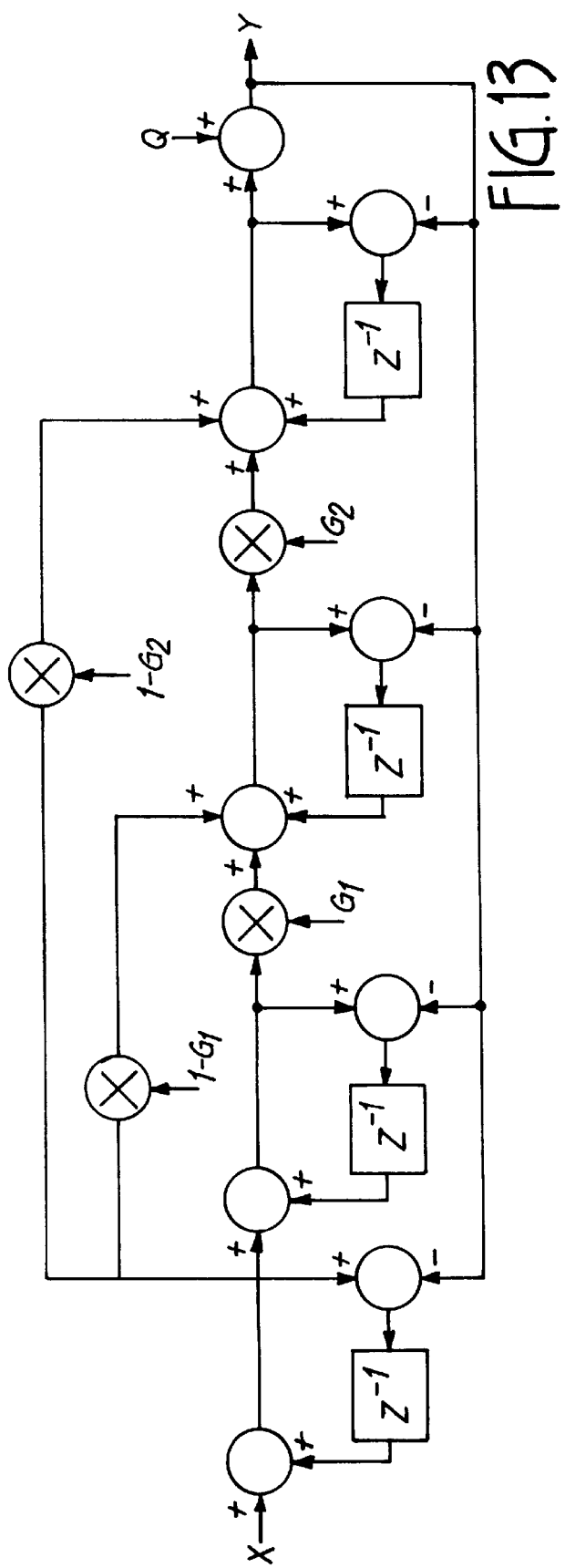
FIG. 13 is a linearized flow diagram of a four stage sigma-delta-sigma modulator of the present invention having feed forward stabilization.

Referring now to FIG. 13, a linearized flow diagram of a four stage sigma-delta-sigma modulator of the present invention having feed forward stabilization is shown.

$$Y=x+[Q(1-z^{-1})^4/(1-z^{-1}(2-G_1G_2-G_2)+z^{-2}(1-G_2))]$$

The same transfer equation also applies when the feed forward network is fed directly from the input (x) and feeds the second and third stages rather than the third and fourth stages as shown. Additional stabilization stages can use $G_i$ interstage gain control and $1-G_i$ feed forward gain control where i is one or more less than the number of stages.

Figure 14:
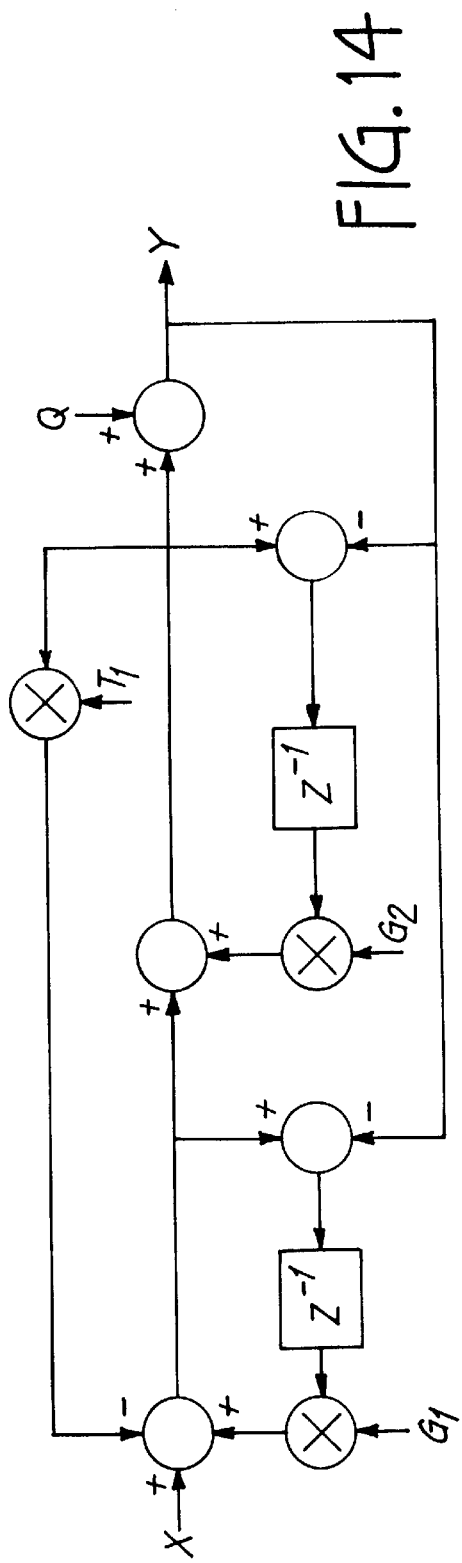
FIG. 14 is a linearized flow diagram of a two stage sigma-delta-sigma modulator-resonator in accordance with the present invention.

Referring now to FIG. 14, a linearized flow diagram of a two stage sigma-delta-sigma modulator-resonator in accordance with the present invention is shown. $T_x$ sets the resonant frequency and $G_x$ controls the stage gain and the resonance bandwidth center frequency ratio. The resonator can be used to increase the usable modulator's low-pass signal bandwidth or to form a bandpass signal bandwidth at some frequency between 0 Hz and one-half the sample rate. When used as a bandpass modulator, the resonator is able to keep a high oversampling ratio while operating at higher center frequencies than would be possible with low-pass modulators and a given sample rate. The oversampling ration being the sample rate divided by twice the signal bandwidth.

The bandpass modulator can be used with tunable $T_x$ and $G_x$ to implement multi-band coverage A/D converters, D/A converters, and digital resolution compressors.

Figure 15:
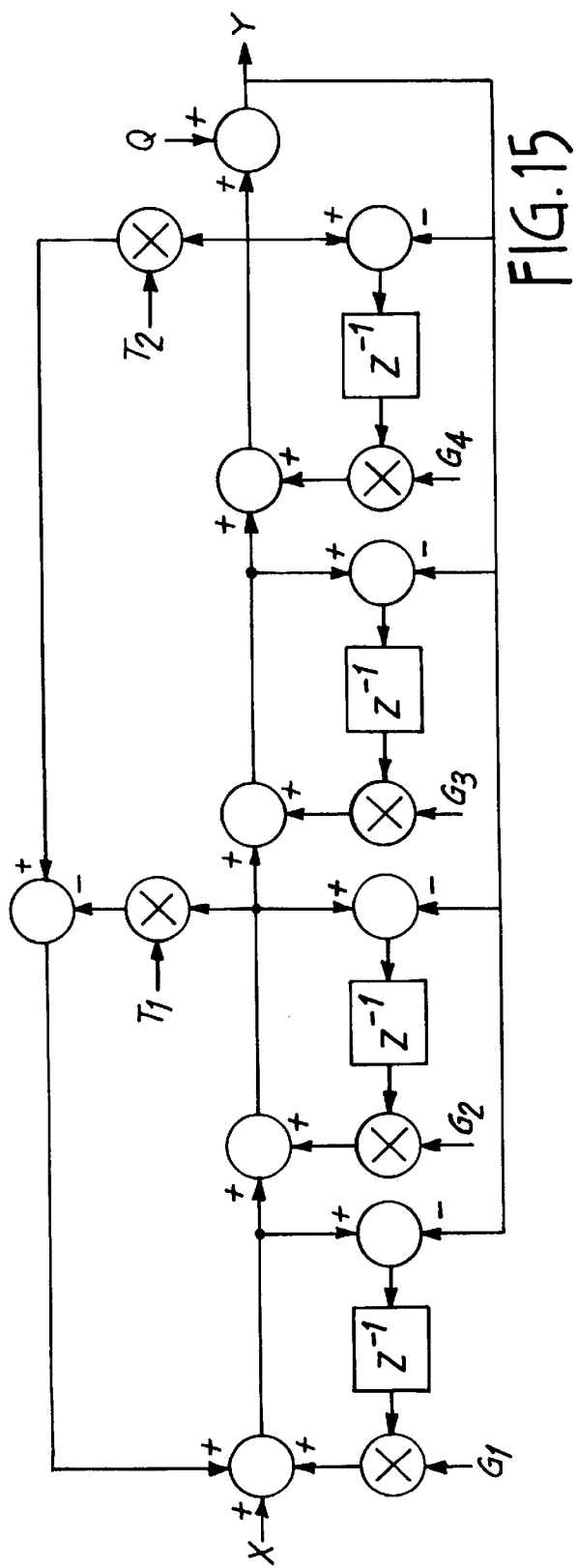
FIG. 15 is a linearized flow diagram of a four stage sigma-delta-sigma modulator resonator in accordance with the present invention.

Referring now to FIG. 15, a linearized flow diagram of a four stage sigma-delta-sigma modulator resonator in accordance with the present invention is shown.

$$Y=[x+Q((1-G_1z^{-1})(1-G_2z^{-1})(1-G_3z^{-1})\ (1-G_4z^{-1})+T_1(1-G_3z^{-1})(1-G_4z^{-1})-T_2)]/(1+T_1-T_2)$$

Figure 16B:
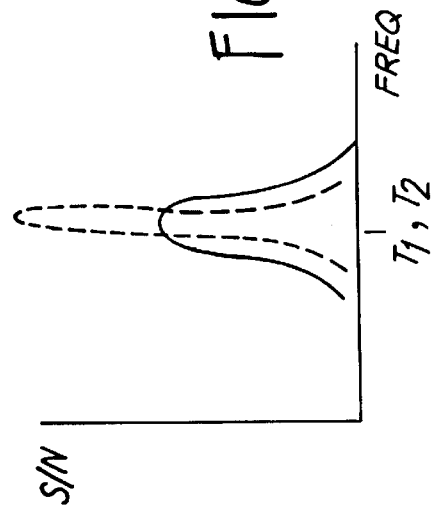
FIGS. 16A and 16B are graphical representations of the noise suppression bandwidth of a sigma-delta-sigma modulator-resonator of the present invention.
Figure 16A:
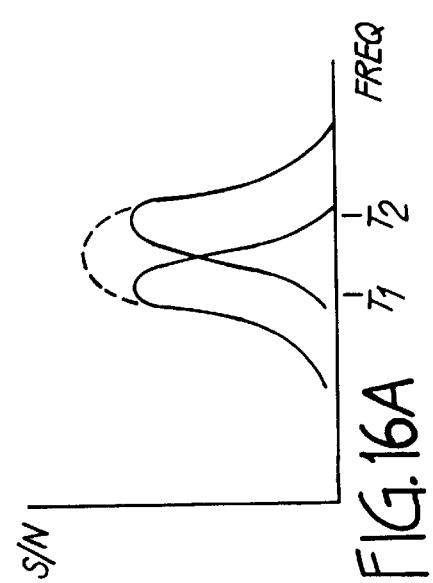

Referring now to FIGS. 16A and 16B graphical representations of the noise suppression bandwidth of a sigma-delta-sigma modulator-resonator of the present invention are shown. Even with multiple resonator stages a flat response on x is maintained. The noise suppression bandwidth can be widened by offsetting the center frequency of each resonator.

The noise suppression depth below signal can be increased by letting $T_1$ equal $T_2$. As $T_1$ and $T_2$ are separated, a wider bandwidth is attained. When $T_1$ and $T_2$ converge, noise suppression is at a maximum value.

Figure 17:
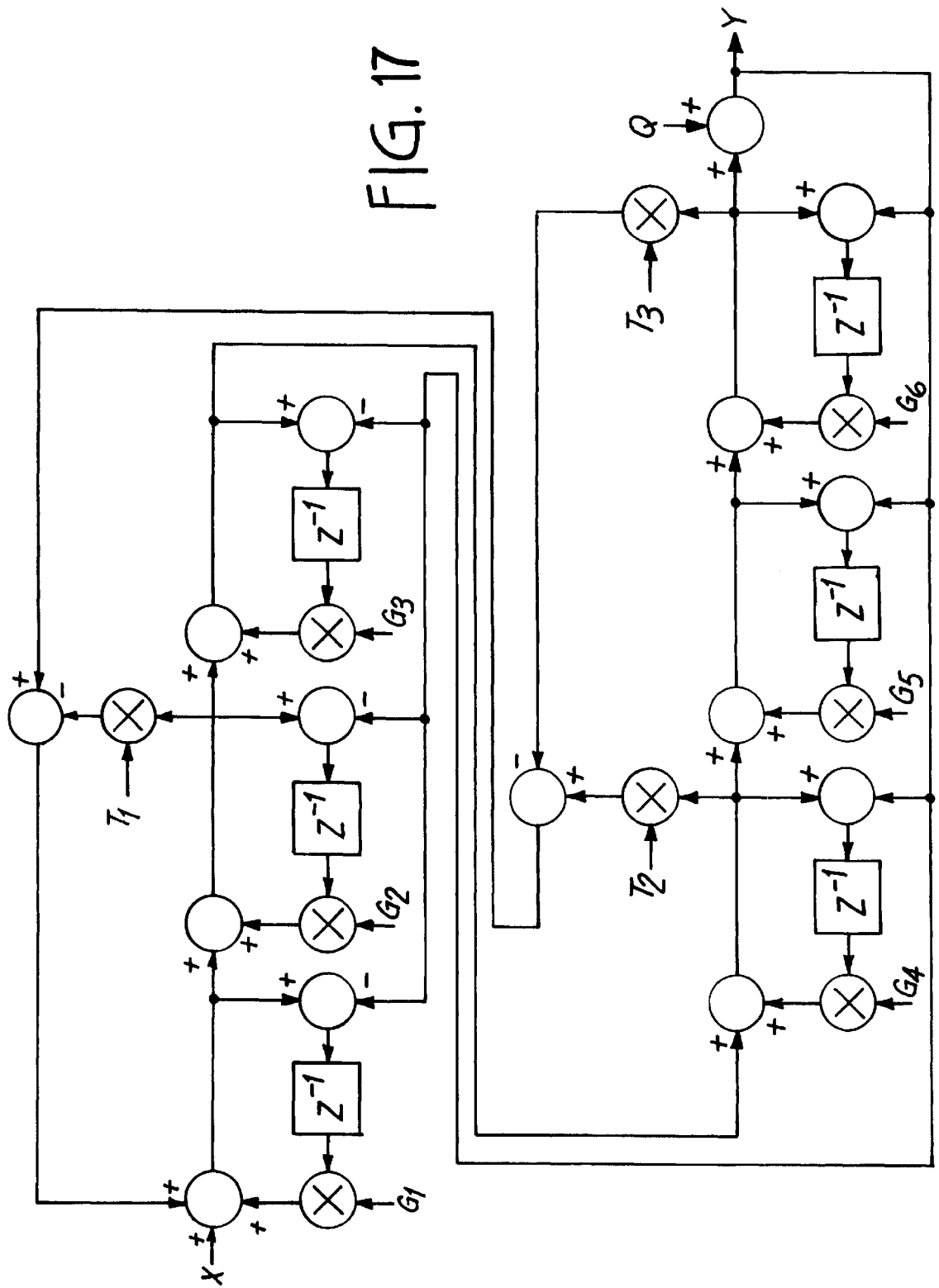
FIG. 17 is a linearized flow diagram of a six stage sigma-delta-sigma modulator-resonator in accordance with the present invention.

Referring now to FIG. 17, a linearized flow diagram of a six stage sigma-delta-sigma modulator-resonator in accordance with the present invention is shown.

$$Y=[x+Q((1-G_1z^{-1})(1-G_2z^{-1})(1-G_3z^{-1})\ (1-G_4z^{-1})(1-G_5z^{-1})(1-G_6z^{-1})+$$
$$T_1(1-G_3z^{-1})*(1-G_4z^{-1})(1-G_5z^{-1})\ (1-G_6z^{-1})-T_2(1-G_5z^{-1})(1-G_6z^{-1})+T_3)]/(1-T_1-T_2+T_3)$$

Figure 18:
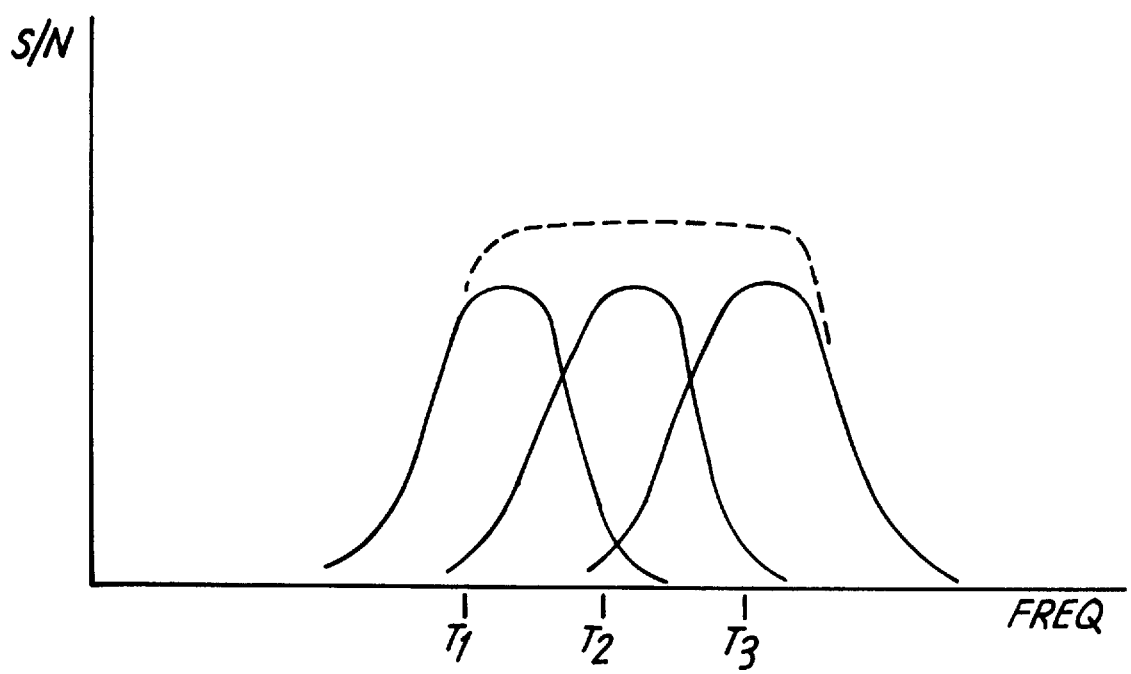
FIG. 18 is a graphical representation of the passband response of a sigma-delta-sigma modulator-resonator of the present invention.

Referring now to FIG. 18, a graphical representation of the passband response of a sigma-delta-sigma modulator-resonator of the present invention is shown. Stability is enhanced by separating the individual resonance frequencies as well as controlling the stage gains.

Figure 19:
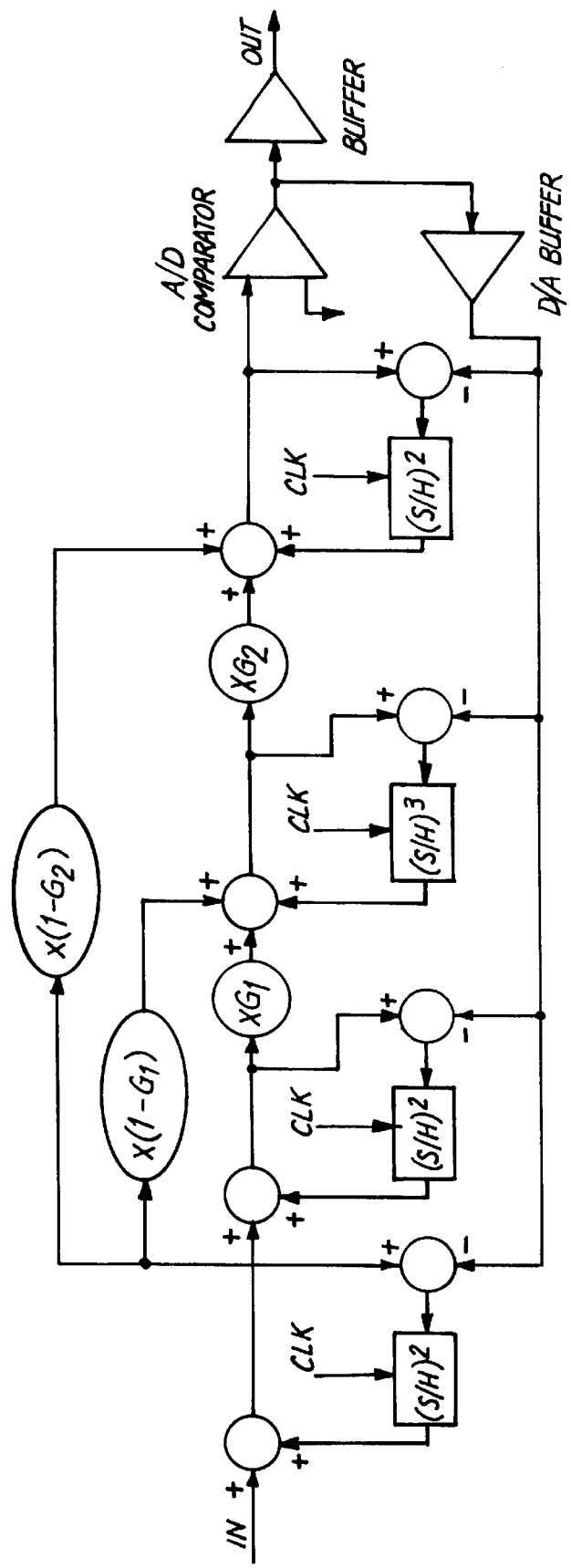
FIG. 19 is a diagram of a four stage sigma-delta-sigma analog-to-digital converter modulator in accordance with the present invention having a stabilized forward feed.

Referring now to FIG. 19, a diagram of a four stage sigma-delta-sigma analog-to-digital converter modulator in accordance with the present invention having a stabilized forward feed is shown. The modulator of FIG. 19 is an embodiment of the flow diagram of FIG. 13. Behavioral model simulations were based on the 4 stage modulator of FIG. 19 utilizing 9.216 GS/s clock rate and stabilizing gain factors $G_1=G_2=0.1$. The results over a 30 MHz signal bandwidth showed a minimum of 184.5 dBc/Hz signal to noise density ratio for a composite two tone RF signal (5 & 13 MHz). This puts the noise floor at or below the thermal input noise and is over 20 dB better than the minimum acceptable HF band performance. Further, the intermodulation and harmonic distortion products were below the noise floor (−120 dBc composite input signal as compared to −96 dBc composite for the two stage modulator with an 18.432 GS/s clock). Although the diagram shows a 1 bit output configuration, a multi-bit A/D quantizer could replace the comparator and a multi-bit D/A converter could replace the buffer for a multi-bit output.

Figure 20:
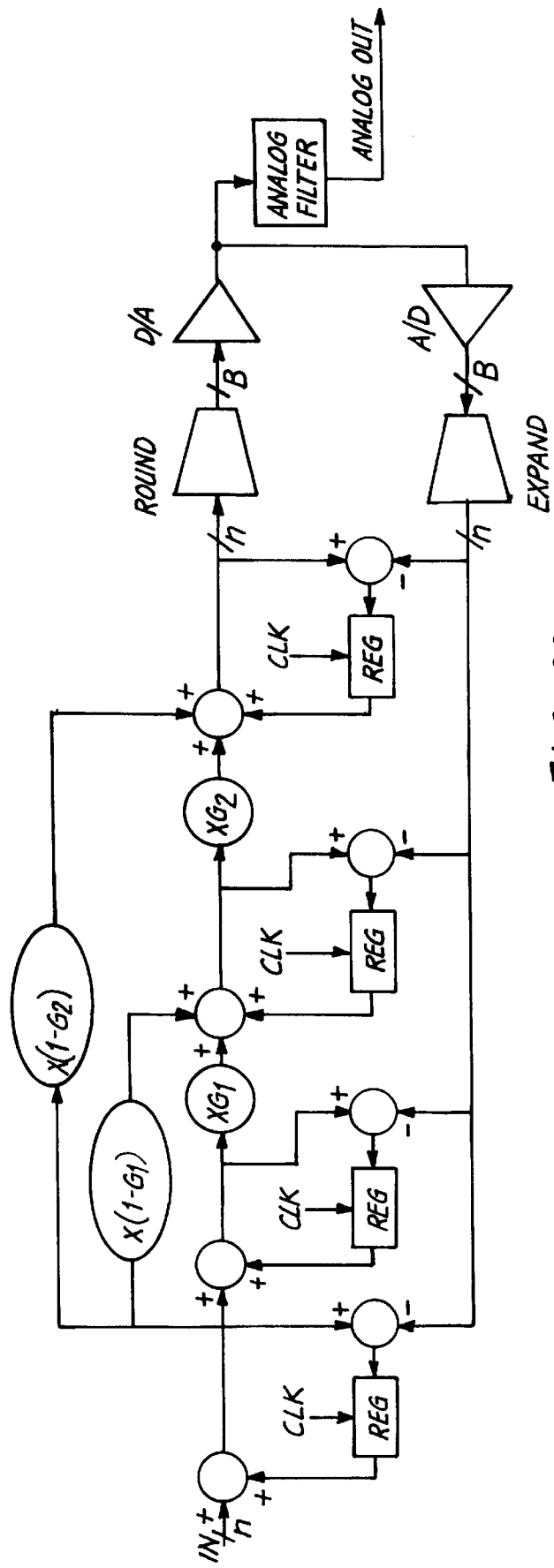
FIG. 20 is a diagram of a four stage sigma-delta-sigma digital-to-analog converter modulator in accordance with the present invention having a stabilized forward feed.

Referring now to FIG. 20, a diagram of a four stage sigma-delta-sigma digital-to-analog converter modulator in accordance with the present invention, having a stabilized forward feed is shown. The modulator of FIG. 20 is also an embodiment of the linearized flow diagram of FIG. 13, as well as D/A converter duality of the A/D converter of FIG. 19. If 'B' bits, which is less than 'n' bits (input resolution), equals 1 bit, the 'D/A' and 'A/D' are generally signal level buffers.

Figure 21:
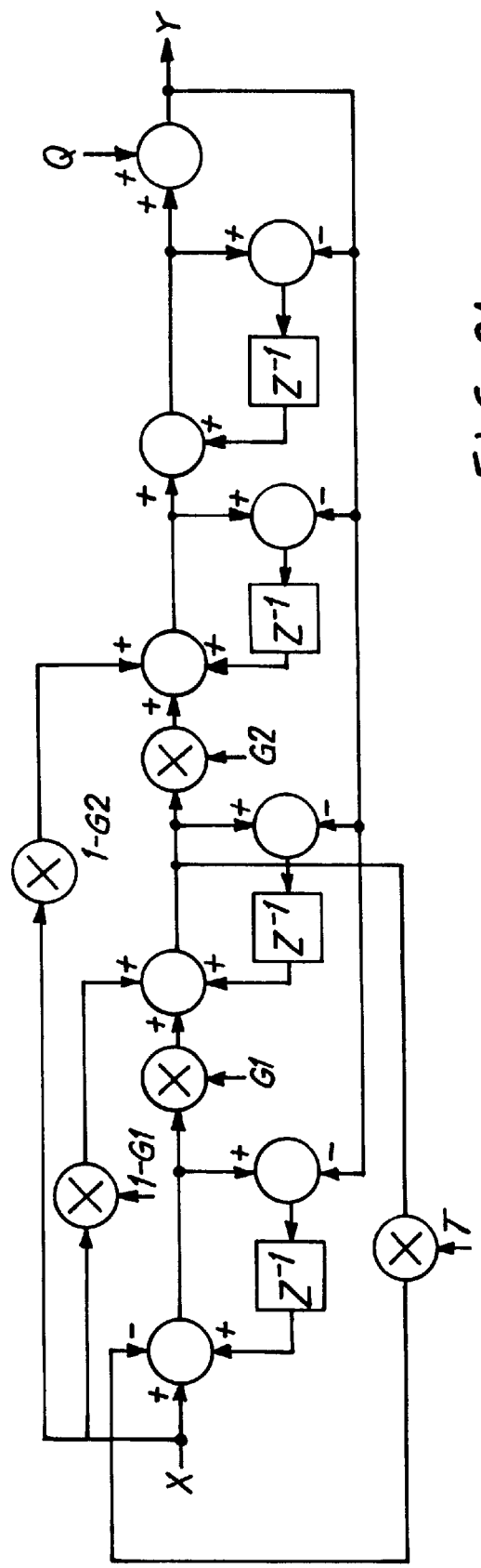
FIG. 21 is a linearized flow diagram of a four stage low pass sigma-delta-sigma modulator of the present invention, having feed forward stabilization and resonator bandpass shaping.

By combining the feed forward stabilization of FIG. 13, the pass band shaping resonator of FIG. 4, and the input rather than the first stage feed forward, a more general, linearized flow diagram of the four stage sigma-delta-sigma modulator in accordance with the present invention is shown in FIG. 21. The 'z' domain transfer equation is:

$$Y=[x[z^{-2}(1-G_2)+z^{-1}(G_1G_2(1-T)+G_1T+G_2-2)+1]+$$
$$Q[(1-z^{-1})^4+G_1T(1-z^{-1})^2]]/[z^{-2}(1-G_2)+z^{-1}(G_1G_2+G_2-2)+G_1T+1].$$

And if the resonator is disabled (strictly low pass), then T=0 and:

$$Y=x+Q(1-z^{-1})^4/[1-z^{-1}(2-G_1G_2-G_2)+z^{-2}(1-G_2)].$$

And if instead the feed forward stabilization was disabled, then $G_1=G_2=1$ and:

$$Y=[x+Q[(1-z^{-1})^4+T(1-z^{-1})^2]]/(1+T).$$

The combination architecture can be expanded to include both a $T_1$ gain for the first 2 stage resonator and a $T_2$ gain for the last 2 stage resonator. Further, additional feed forward stabilization can be obtained by adding 'G₃' and '1–G₃' gain elements prior to the 4th stage, and if desired adding 'G₄' and '1–G₄' gain elements prior to the quantizer. The sigma-delta-sigma combination architecture can be further expanded by similar 'T$_x$' and 'G$_x$' deletions/additions to obtain other numbers of stages, lesser/greater in number.

Figure 22:
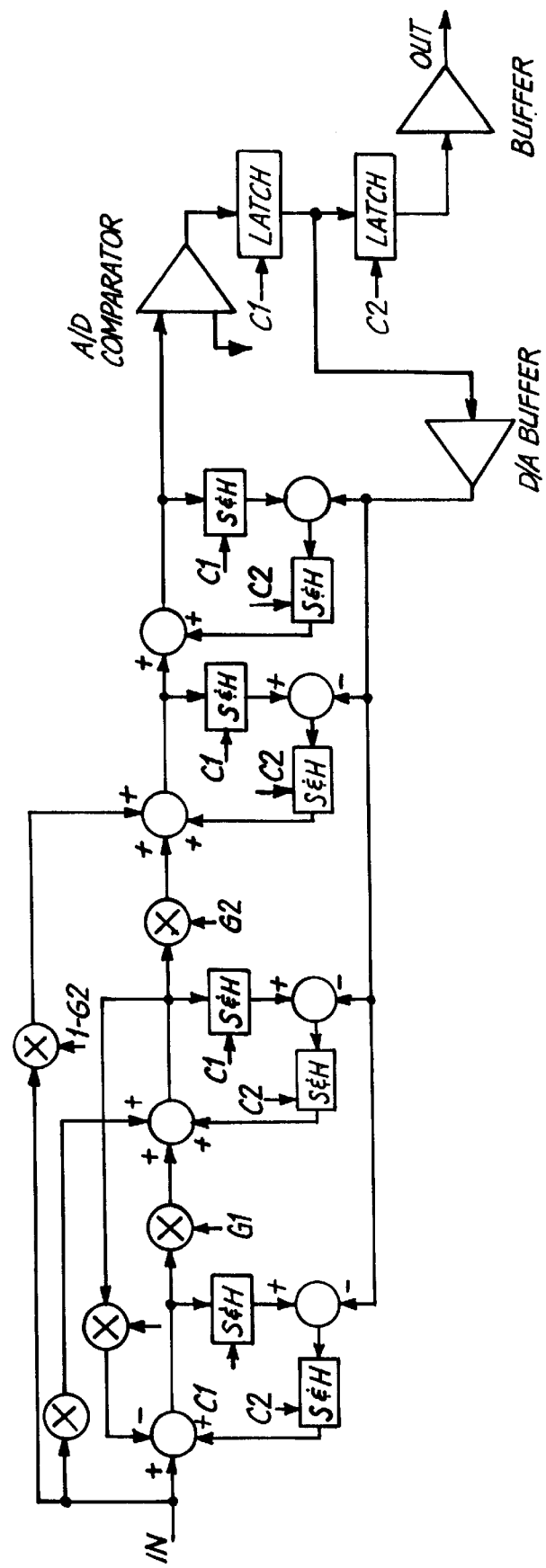
FIG. 22 is a diagram for the implementation of FIG. 20 four stage sigma-delta-sigma analog-to-digital converter modulator of the present invention, utilizing passed input signal.

Referring now to FIG. 22, a diagram of a four stage sigma-delta-sigma analog-to-digital converter modulator in accordance with the present invention, having passed input signal and dual clock phase ('C1' and 'C2' sample and hold delay elements is shown. The modulator of FIG. 22 is an embodiment of the flow diagram of FIG. 21. The 2 phase clock allows for presampling of both the stage outputs and the quantizer on clock phase 1, signal settle time for the subtracted combination, and resampling with clock phase 2. This architecture basically eliminates loop oscillations due to loop transient amplification that may propogate to the quantizer. The net result is essentially a spurious free modulator output.

Figure 23:
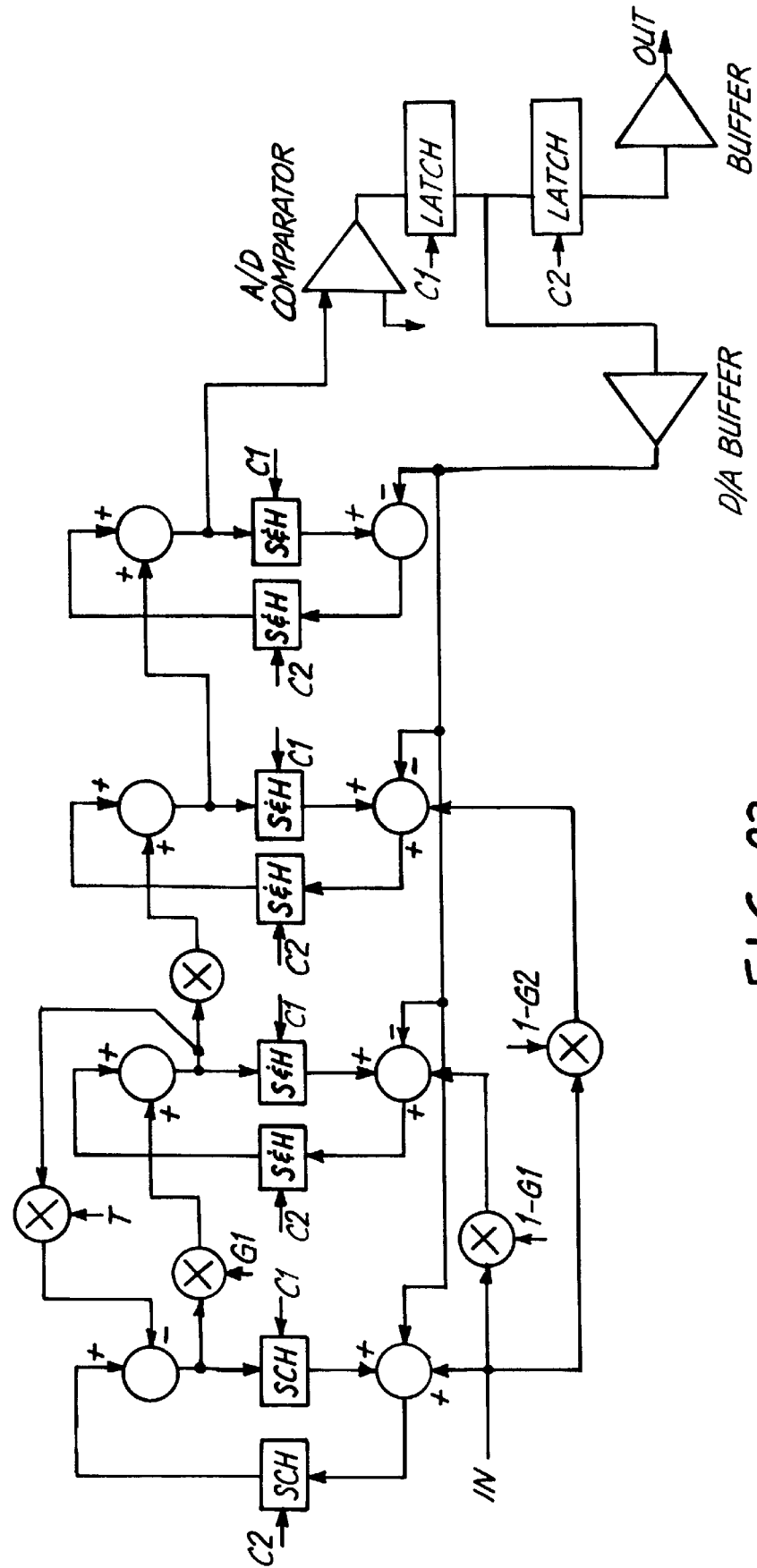
FIG. 23 is a diagram for the implementation of FIG. 20 four stage sigma-delta-sigma analog-to-digital converter modulator of the present invention, utilizing sampled input signal.

Referring now to FIG. 23, a diagram of a four stage sigma-delta-sigma analog-to-digital converter modulator in accordance with the present invention, having sampled input signal and dual clock phase sample and hold delay elements is shown. This architectural variation has the same transfer functions described for FIG. 21, but has the potentially added benefit of presampling both the input and feedback signals.

Figure 24:
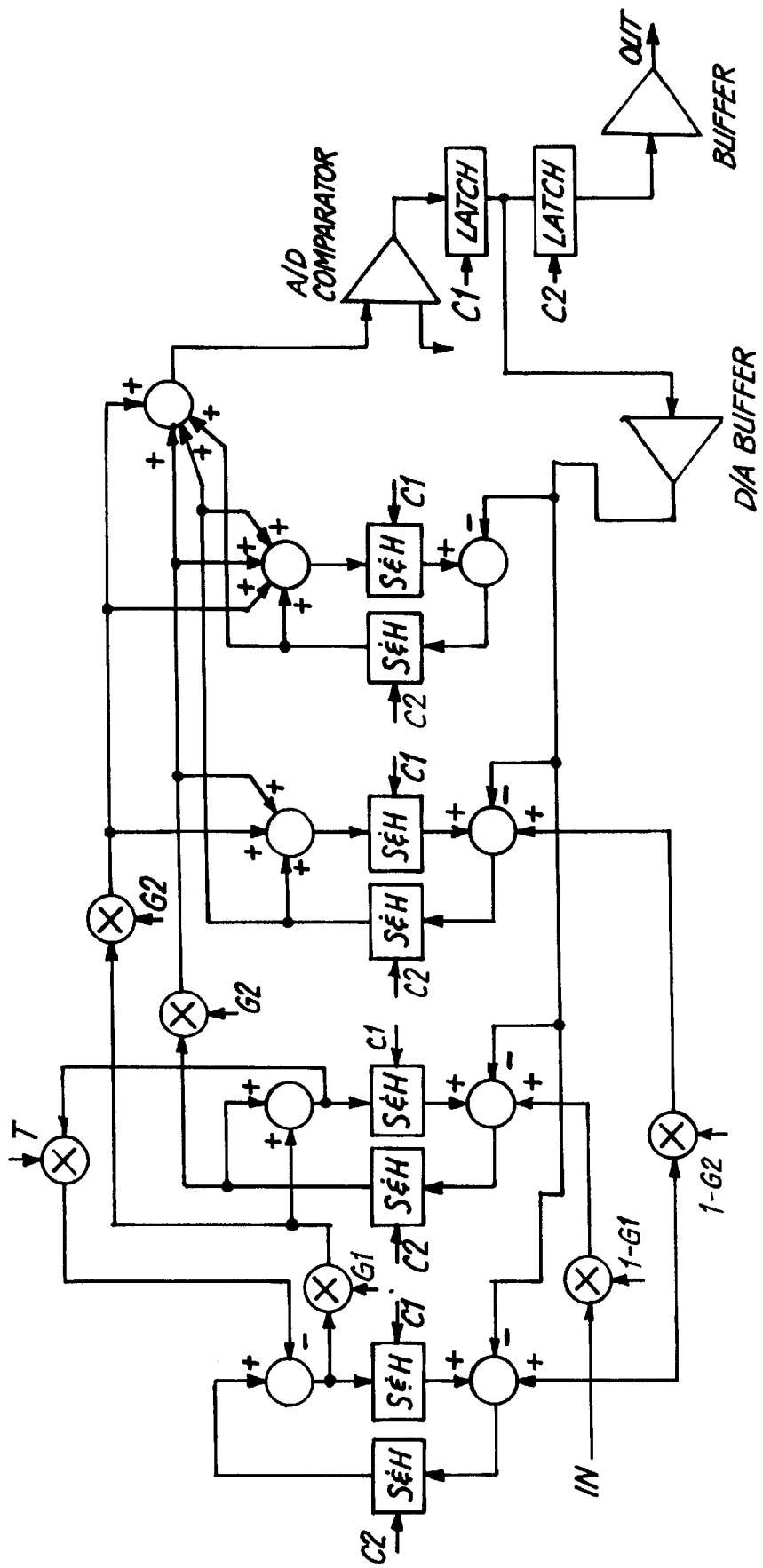
FIG. 24 is a diagram for the implementation of FIG. 20 four stage sigma-delta-sigma analog-to-digital converter modulator of the present invention, utilizing sampled input signal and parallel interstage transfers.

Referring now to FIG. 24, a diagram of the four stage sigma-delta-sigma modulator shown in FIG. 23, with interstage signal flow in parallel rather than in cascade, such that forward propagation delay is minimized, in accordance with the present invention is shown. This paralleling technique can be applied to the pass architecture of FIG. 22 also, to minimize forward propagation delay.

Although the diagrams (FIGS. 22, 23, and 24) show a 1 bit output configuration, a multi-bit A/D quantizer could replace the comparator and a multi-bit D/A converter could replace the buffer for a multi-bit output.

Figure 25:
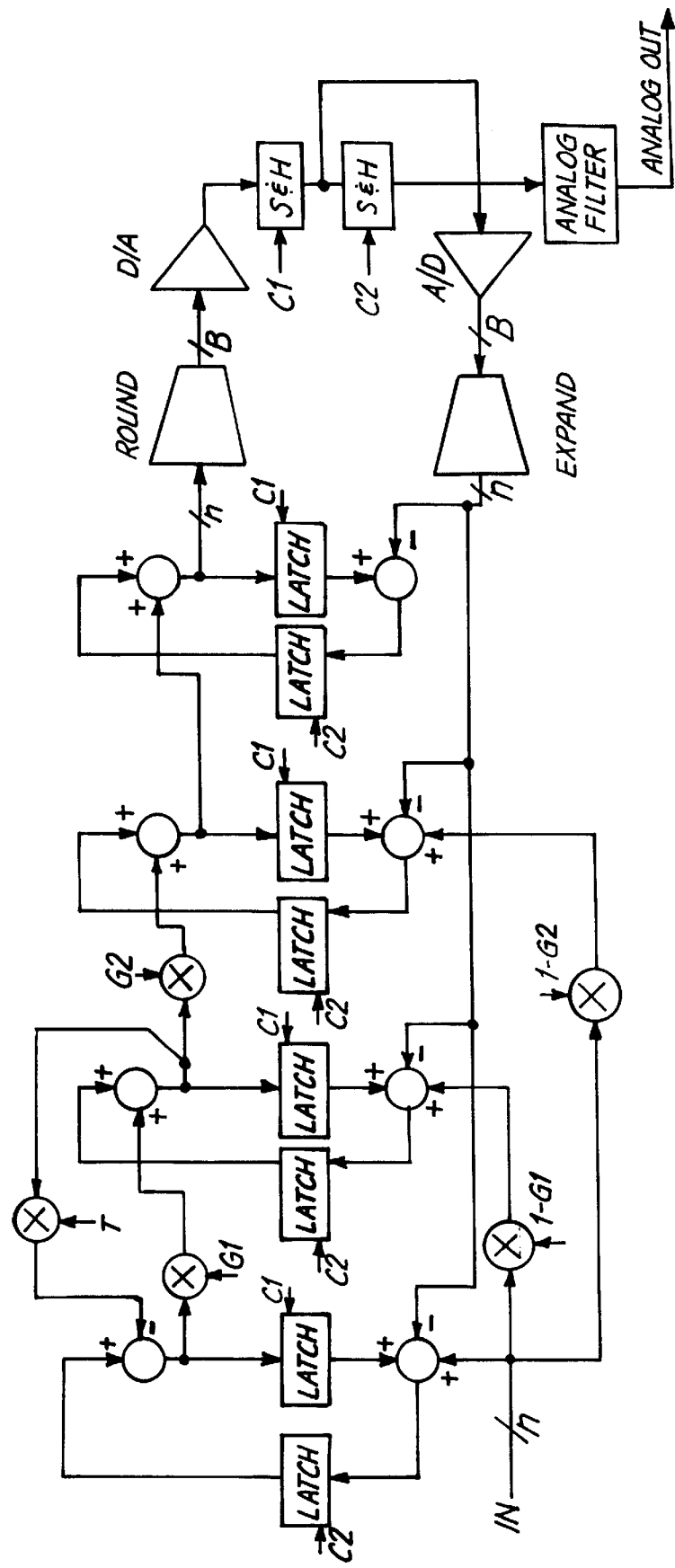
FIG. 25 is a diagram for the implementation of FIG. 20 of a four stage sigma-delta-sigma digital-to-analog converter modulator of the present invention.

Referring to FIG. 25, a diagram of a four stage sigma-delta-sigma digital-to-analog converter modulator in accordance with the present invention, also an embodiment of the linearized flow diagram of FIG. 21 is shown. FIG. 25 is the D/A converter duality of the A/D converter of FIG. 23. By similar substitutions of sample and hold (S&H) for latches and vice versa and similar swapping of 'A/D' and 'D/A' functions, D/A converter architectures can be formed for the A/D converter architectures of FIGS. 22 and 24 also.

Figure 26:
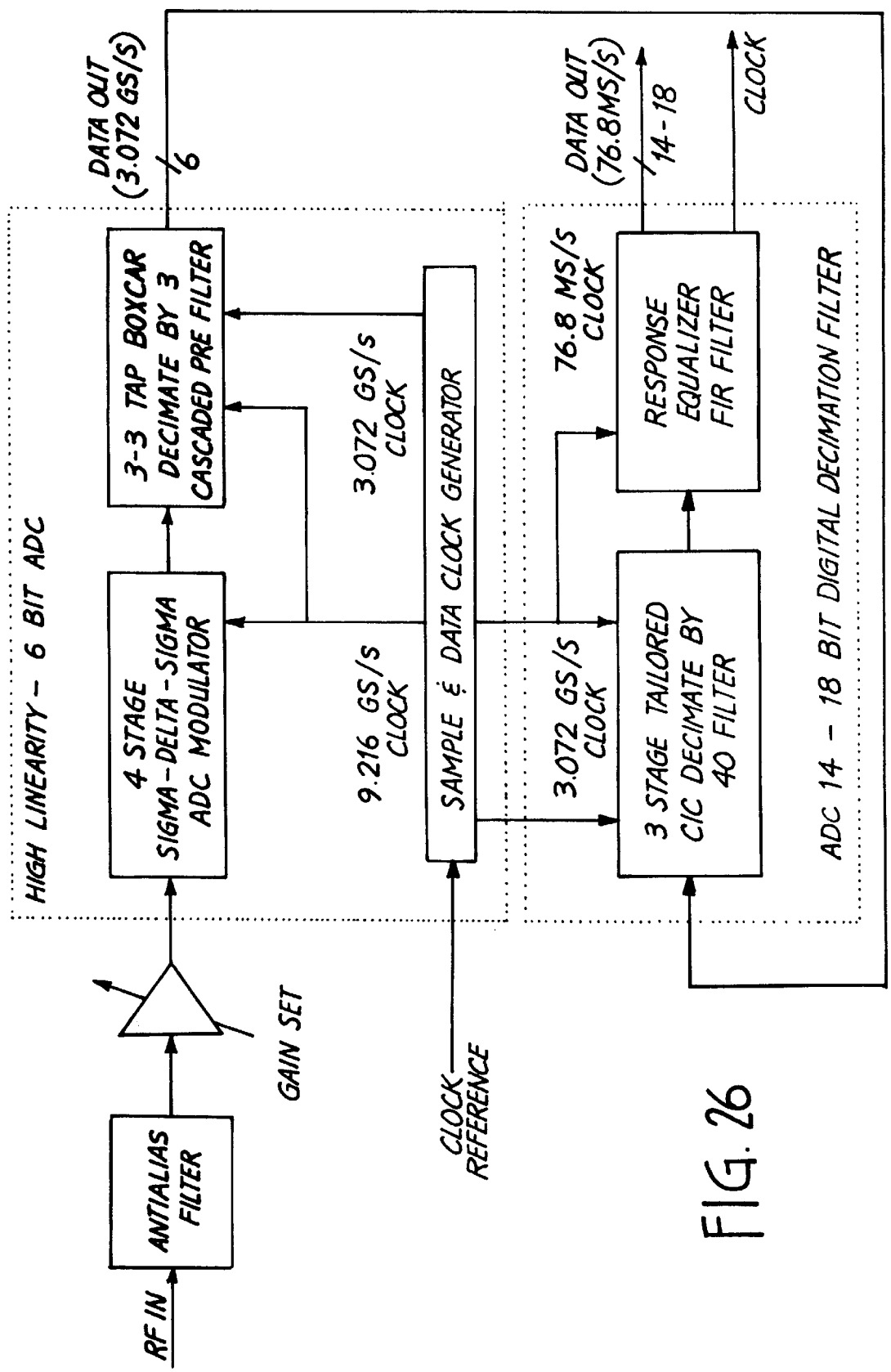
FIG. 26 is a diagram of a high-frequency band analog-to-digital converter in accordance with the present invention.

Referring now to FIG. 26, a diagram of a high-frequency band analog-to-digital converter in accordance with the present invention is shown. The example block diagram represents a restructuring of the high performance analog-to-digital conversion system from that shown in FIG. 2 and is based on a 4 stage SDS modulator (FIG. 19), clocked at 9.216 GS/s. For completeness in elaborating the invention's utilization, potential decimation filter architectures for the example ADC system are provided.

Figure 27:
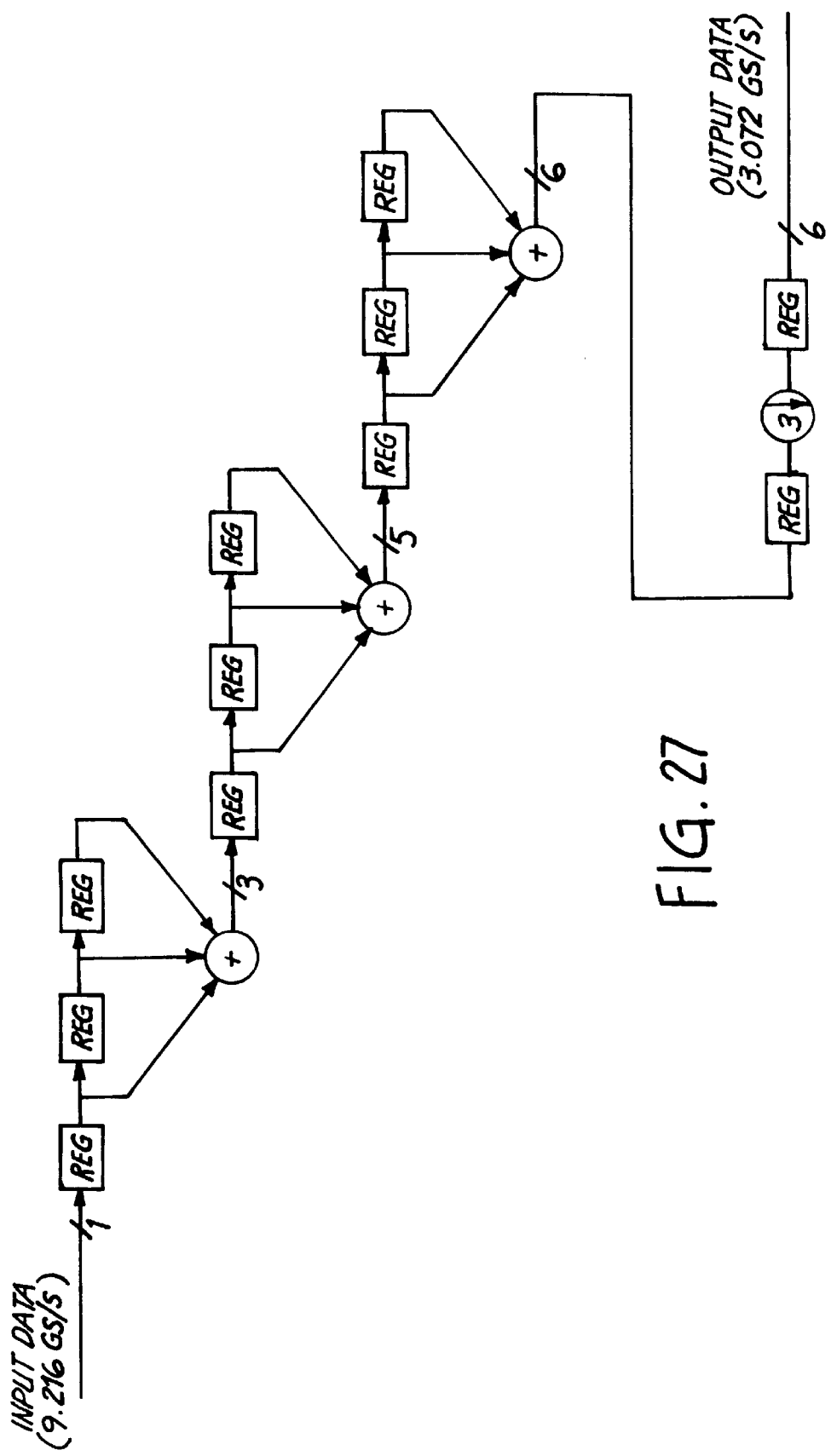
FIG. 27 is a diagram of a triple three tap boxcar cascaded decimate-by-three prefilter in accordance with the present invention.

Referring now to FIG. 27, a diagram of a triple three tap boxcar cascaded decimate-by-three prefilter in accordance with the present invention is shown. By using high performance RF anti-alias filters (9 to 11 pole) prior to conversion, only the out-of-band noise generated by the modulator needs to be suppressed by the decimation filtering. Since the current requirement is to decimate down from a 9.216 GS/s data rate, two filters are required: a decimate-by-three three stage 3 tap per stage boxcar filter on the modulator part and a decimate-by-40 three stage CIC filter with tailored comb resonance frequency placement and a single corner resonator at 30 MHz. The 3-stage, 6-bit boxcar filter frequency response has a 0.004 dB passband ripple with protected ±30 MHz bandwidth at –116 dBc in the decimated output. The performance for a 100 MHz bandpass is –0.041 dB ripple with a –84 dBc protected ± MHz bandwidth in the decimated output. The decimation prefilter suppresses the high frequency noise in a band around $F_s/2$ (Nyquist Frequency) such that the decimate-by-three operation will not fold performance degrading energy into the passband.

Figure 28:
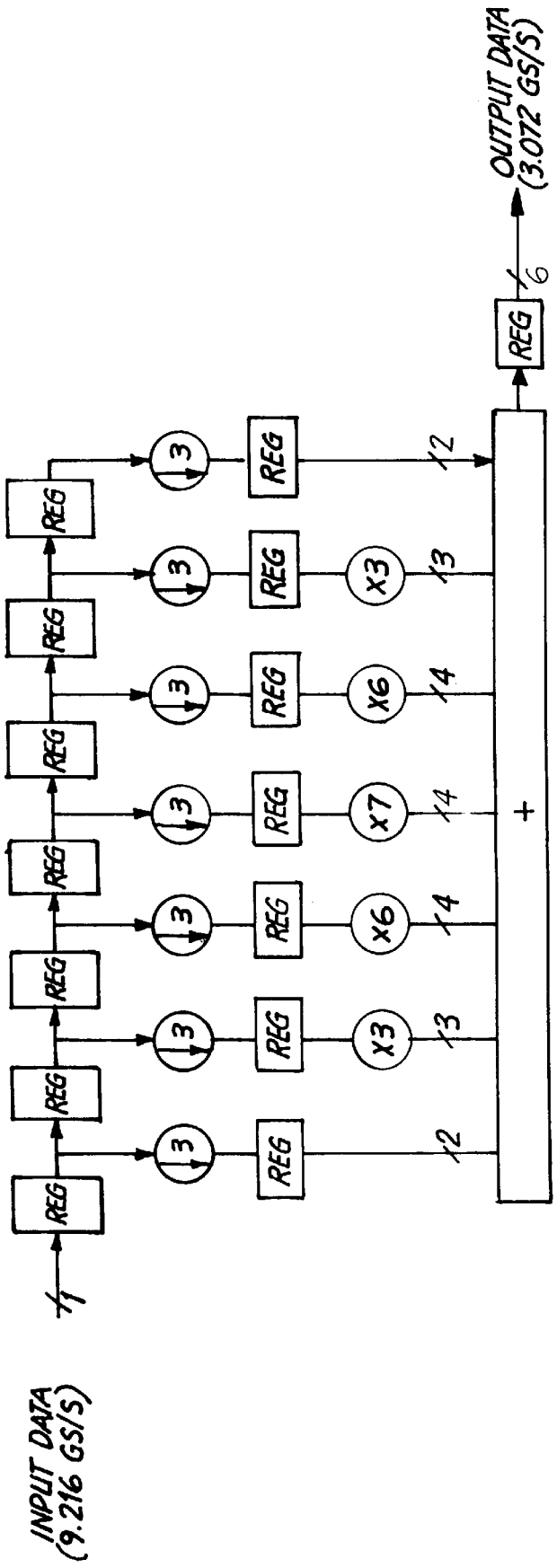
FIG. 28 is a diagram of a triple three tap boxcar cascaded decimate-by-three decimate before filter.

Referring now to FIG. 28, a diagram of a triple three tap boxcar cascaded decimate-by-three decimate before filter is shown. Since it is generally better to process addition operations at a lower clock speed when possible, and multiplications at even lower clock speeds, the prefilter can be reconfigured to the decimate before filter form shown. This requires simple multiplications which can be pipelined with shift and add stages. For example, X7 equals X4 (binary shift two bits left)+X2 (binary shift one bit left)+X1.

Figure 29:
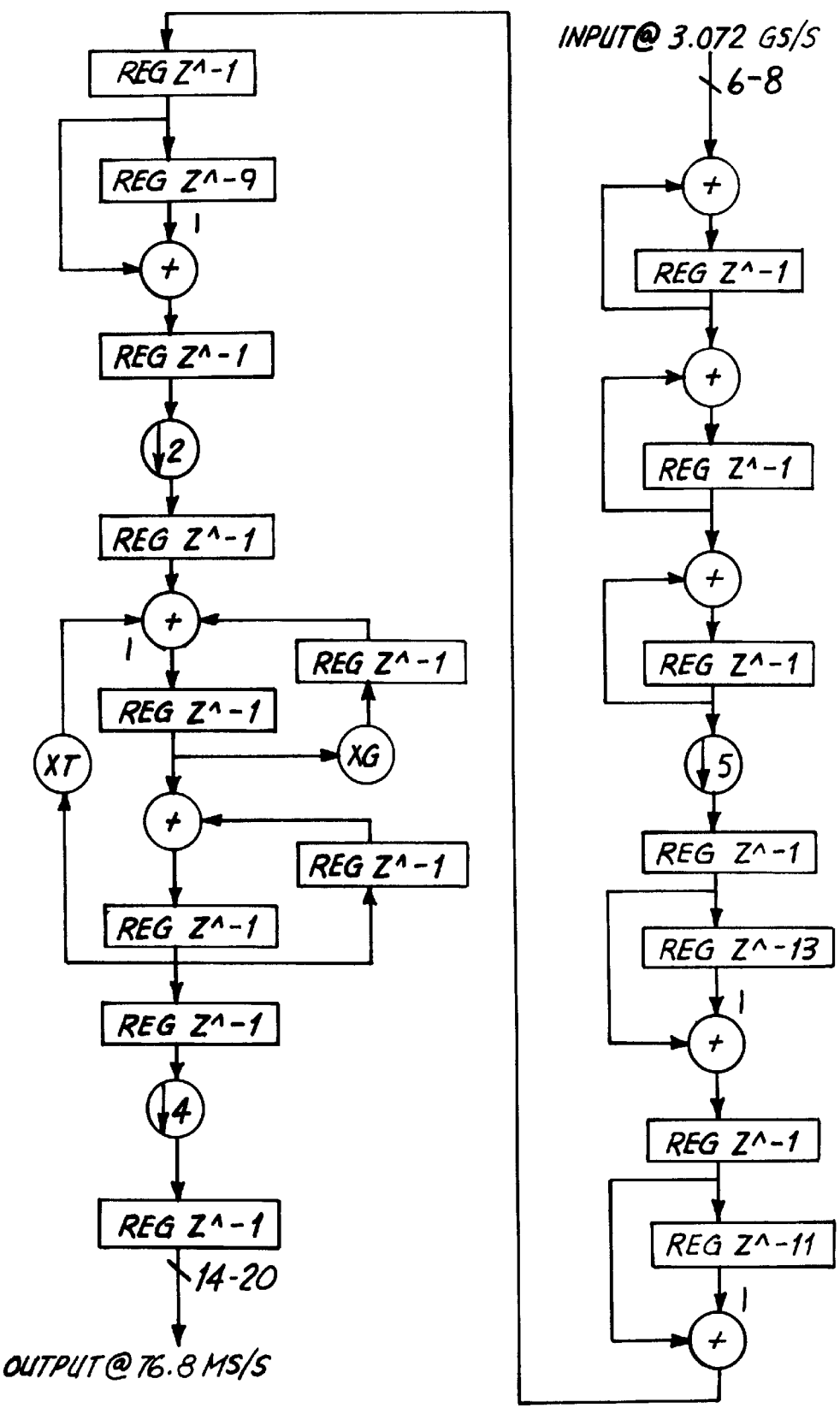
FIG. 29 is a diagram of a three stage tailored cascaded-integrator-comb decimate-by-40 filter having a corner resonator.

Referring now to FIG. 29, a diagram of a three stage tailored cascaded-integrator-comb decimate-by-40 filter having a corner resonator is shown. The 3-stage 18-bit CIC decimation filter's frequency response protects the required A/D performance over the 30 MHz output bandwidth by suppressing the remaining out of band energy that was folded down by the prefilter. The 76.8 MS/s output rate is low enough for high speed CMOS digital down converter parts such as Harris Semiconductor's HSP50016. The filter comprises 3 digital integrators (26 bit input resolution), a decimate-by-five, three digital differentiators (comb stages with feed forward delays of 13, 11 and 9 clock cycles), a decimate-by-two, a digital corner resonator at 30 MHz, a final decimate-by-four, and an FIR 8-to-20 tap equalizing filter. The integrators can run as five parallel strings at one-fifth the input clock rate to be compatible with GaAs direct coupled FET logic gate arrays. The input and fan-out to the lower rate can be accomplished by GaAs source coupled FET logic. Vitesse Semiconductor, for one supplier, can provide gate arrays with both source coupled and direct coupled FET logic on the same part.

It is believed that the sigma-delta-sigma modulator for high performance analog-to-digital and digital-to-analog conversion of the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A sigma-delta-sigma modulator for analog-to-digital signal conversion, comprising:

one or more filter stages in cascade, connected from the modulator input and connected to an A/D quantizer, the digital data output of which is passed through a D/A (digital-to-analog) converter, and returned to each filter stage;

each filter stage comprising an input summer connected to the output and to an output summer where the D/A output is subtracted from the stage output, the output summer connected through a delay element and then through zero or more gain adjust elements and summed at the input summer; and the modulator input connected to the input summer of the first filter stage in cascade.

2. A sigma-delta-sigma modulator as claimed in claim 1, wherein the filter stage delay elements are sample rate synchronously clocked sample, hold, and delay services.

3. A sigma-delta-sigma modulator as claimed in claim 2, wherein the A/D quantizer is a 1 bit output comparator and the D/A is a 1 bit input, bipolar analog output buffer.

4. A sigma-delta-sigma modulator as claimed in claim 2, wherein filter stages are separated by stabilizing gain adjustment elements $G_x$, with a prior stage's input being gain adjusted by elements $(1-G_x)$, passed around elements $G_x$ and summed with the output of elements $G_x$.

5. A sigma-delta-sigma modulator as claimed in claim 2, wherein filter stages are grouped in even order cascade sets, with each pair output fed back, passed through a gain adjust element '$T_x$', and summed (spanning groups of 4 stages) or subtracted (spanning odd groups of 2 stages) with stage set input.

6. A sigma-delta-sigma modulator as claimed in claim 5, wherein filter stages can be separated by stabilizing gain adjustment elements $G_x$, with a prior stage's input being gain adjusted by elements $(1-G_x)$, passed around elements $G_x$ and summed with the output of elements $G_x$.

7. A sigma-delta-sigma modulator as claimed in claim 2, wherein the A/D quantizer has a multi-bit output of resolution 'n' bits and the D/A has an 'n' bit input with a $2^n$ level analog output.

8. A sigma-delta-sigma modulator as claimed in claim 1, further comprising an output buffer receiving the digital output signal, being fed back to the D/A converter, for providing a buffered digital output signal.

9. A sigma-delta-sigma modulator for analog-to-digital signal conversion, comprising:
one or more filter stages in cascade, connected from the modulator input and connected to an A/D quantizer, the digital output of which is passed through a phase 1 clocked latch, through a D/A converter, and returned to each filter stage;
each filter stage comprising an input summer connected to the output and to a phase 1 clocked sample and hold device, the output of which is connected to an output summer where the D/A output is subtracted from it, the output summer connected through a phase 2 clocked sample and hold device delay and then through zero or more gain adjust elements and summed at the input summer; and
the modulator input connected to the input summer of the first filter stage in cascade.

10. A sigma-delta-sigma modulator as claimed in claim 9, in which the phase 1 clock to phase 2 clock time separation is such that time delay around the filter loop signal path is approximately 1 clock rate period.

11. A sigma-delta-sigma modulator as claimed in claim 10, wherein the A/D quantizer is a 1 bit output comparator and the D/A is a 1 bit input, bipolar analog output buffer.

12. A sigma-delta-sigma modulator as claimed in claim 10, wherein the filter stages can be separated by stabilizing gain adjustment elements $G_x$, with a prior stage's input being gain adjusted by elements $(1-G_x)$, passed around elements $G_x$ and summed with the output elements of $G_x$.

13. A sigma-delta-sigma modulator as claimed in claim 10, wherein filter stages are grouped in even order cascade sets, with each pair output fed back, passed through a gain adjust element '$T_x$', and summed (spanning groups of 4 stages) or subtracted (spanning odd groups of 2 stages) with stage set input.

14. A sigma-delta-sigma modulator as claimed in claim 13, wherein filter stages can be separated by stabilizing gain adjustment elements $G_x$, with a prior stages input being gain adjusted by elements $(1-G_x)$, passed around elements $G_x$ and summed with the output of elements $G_x$.

15. A sigma-delta-sigma modulator as claimed in claim 10, wherein the A/D quantizer has a multi-bit output of resolution 'n' bits and the D/A has an 'n' bit input with a $2^n$ level analog output.

16. A sigma-delta-sigma modulator as claimed in claim 10, further comprising a phase 2 clocked latch receiving the digital output signal, being fed back to the D/A converter, and passing the latched signal through an output buffer for providing a buffered digital output.

17. A sigma-delta-sigma modulator for analog-to-digital signal conversion, comprising:
one or more filter stages in cascade, connected from the modulator input and connected to an A/D quantizer, the digital data output of which is passed through a phase 1 clocked latch, through a D/A converter, and returned to each filter stage;
each filter stage comprising an input summer connected to the output and to a phase 1 clocked sample and hold device, the output of which is connected to an output summer where the D/A output is subtracted from it, the output summer connected through a phase 2 clocked sample and hold device delay and then through zero or more gain adjust elements and summed at the input summer; and
the modulator input connected to the output summer of the first filter stage in cascade.

18. A sigma-delta-sigma modulator as claimed in claim 17, in which the phase 1 clock to phase 2 clock time separation is such that time delay around the filter loop signal path is approximately 1 clock rate period.

19. A sigma-delta-sigma modulator as claimed in claim 18, wherein the A/D quantizer is a 1 bit output comparator and the D/A is a 1 bit input, bipolar analog output buffer.

20. A sigma-delta-sigma modulator as claimed in claim 18, wherein filter stages are separated by stabilizing gain adjustment elements $G_x$, with the modulator input being gain adjusted by elements $(1-G_x)$, passed around elements $G_x$ and summed with the next filter stage's output summer.

21. A sigma-delta-sigma modulator as claimed in claim 18, wherein filter stages are grouped in even order cascade sets, with each pair output fed back, passed through a gain adjust element '$T_x$', and summed (spanning groups of 4 stages) or subtracted (spanning odd groups of 2 stages) with stage set input summer.

22. A sigma-delta-sigma modulator as claimed in claim 21, wherein filter stages are separated by stabilizing gain adjustment elements $G_x$, with the modulator input being gain adjusted by elements $(1-G_x)$, passed around elements $G_x$ and summed with the next filter stage's output summer.

23. A sigma-delta-sigma modulator as claimed in claim 18, wherein the A/D quantizer has a multi-bit output of resolution 'n' bits and the D/A has an 'n' bit input with a $2^n$ level analog output.

24. A sigma-delta-sigma modulator as claimed in claim 18, further comprising a phase 2 clocked latch receiving the digital output signal, being fed back to the D/A converter, and passing the latched signal through an output buffer for providing a buffered digital output.

25. A sigma-delta-sigma modulator for digital-to-analog signal conversion, comprising:
one or more filter stages in cascade, connected from the modulator input and connected to a rounding element (resolution reducer), the output of which is connected to a D/A converter, the analog output of which is passed through an A/D converter and then through a digital resolution expander and returned to each filter stage;

each filter stage comprising an input summer connected to the output and to an output summer where the expanded A/D output is subtracted from the stage output, the output summer connected through a delay element and then through zero or more gain adjust elements and summed at the input summer; and the modulator input connected to the input summer of the first filter stage in cascade.

26. A sigma-delta-sigma modulator as claimed in claim 25, wherein the filter stage delay elements are sample rate clocked delay registers.

27. A sigma-delta-sigma modulator as claimed in claim 26, wherein the rounding element has a single bit output, the D/A is a bipolar analog output buffer, the A/D converter is a 1 bit output comparator, and the resolution expander has a multi-bit output.

28. A sigma-delta-sigma modulator as claimed in claim 26, wherein filter stages are separated by stabilizing gain adjustment elements $G_x$, with a prior stage's input being gain adjusted by elements $(1-G_x)$, passed around elements $G_x$ and summed with the output of elements $G_x$.

29. A sigma-delta-sigma modulator as claimed in claim 26, wherein filter stages are grouped in even order cascade sets, with each pair output fed back, passed through a gain adjust element '$T_x$', and summed (spanning groups of 4 stages) or subtracted (spanning odd groups of 2 stages) with stage set input.

30. A sigma-delta-sigma modulator as claimed in claim 29, wherein filter stages are separated by stabilizing gain adjustment elements $G_x$, with a prior stage's input being gain adjusted by elements $(1-G_x)$, passed around elements $G_x$ and summed with the output of elements $G_x$.

31. A sigma-delta-sigma modulator as claimed in claim 25, further comprising an analog filter receiving the D/A converter output signal for providing a reconstructed analog output signal.

32. A sigma-delta-sigma modulator as claimed in claim 26, wherein the rounding element has a multi-bit output (resolution less than modulator input resolution), a multi-bit D/A converter, a multi-bit A/D converter, and a resolution expansion element (input and output resolution equal to rounding element output and input resolution respectively).

33. A sigma-delta-sigma modulator for digital-to-digital signal resolution compression, comprising:

one or more filter stages in cascade, connected from the modulator input and connected to a rounding element (resolution reducer), the output of which passed through a digital resolution expander and returned to each filter stage;

each filter stage comprising an input summer connected to the output and to an output summer where the expanded A/D output is subtracted from the stage output, the output summer connected through a delay element and then through zero or more gain adjust elements and summed at the input summer; and the modulator input connected to the input summer of the first filter stage in cascade.

34. A sigma-delta-sigma modulator as claimed in claim 33, wherein the filter stage delay elements are sample rate clocked delay registers.

35. A sigma-delta-sigma modulator as claimed in claim 34, wherein the rounding element has an output resolution less than the modulator input resolution, and a resolution expansion element (input and output resolution equal to rounding element output and input resolution respectively).

36. A sigma-delta-sigma modulator as claimed in claim 35, wherein the filter stages are separated by stabilizing gain adjustment elements $G_x$, with a prior stage's input being gain adjusted by elements $(1-G_x)$, passed around elements $G_x$ and summed with the output of elements $G_x$.

37. A sigma-delta-sigma modulator as claimed in claim 35, wherein filter stages are grouped in even order cascade sets, with each pair output fed back, passed through a gain adjust element '$T_x$', and summed (spanning groups of 4 stages) or subtracted (spanning odd groups of 2 stages) with stage set input.

38. A sigma-delta-sigma modulator as claimed in claim 37, wherein the filter stages are separated by stabilizing gain adjustment elements $G_x$, with a prior stage's input being gain adjusted by elements $(1-G_x)$, passed around elements $G_x$ and summed with the output of elements $G_x$.

39. A sigma-delta-sigma modulator for digital-to-analog signal conversion, comprising:

one or more filter stages in cascade, connected from the modulator input and connected to a rounding element (resolution reducer), the output of which is connected to a D/A converter, the analog output of which is phase 1 clocked through a sample and hold device, then routed through an A/D converter and then through a digital resolution expander and returned to each filter stage;

each filter stage comprising an input summer connected to the output and to a phase 1 clocked latch; the output of which is connected to an output summer where the A/D expanded output is subtracted from it, the output summer connected through a phase 2 clocked latch and then through zero or more gain adjust elements and summed at the input summer;

the modulator input connected to the input summer of the first filter stage in cascade.

40. A sigma-delta-sigma modulator as claimed in claim 39, in which the phase 1 clock to phase 2 clock time separation is such that time delay around the filter loop signal path is approximately 1 clock rate period.

41. A sigma-delta-sigma modulator as claimed in claim 40, wherein the rounding element has a single bit output, the D/A is a bipolar analog output buffer, the A/D converter is a 1 bit output comparator, and the resolution expander has a multi-bit output.

42. A sigma-delta-sigma modulator as claimed in claim 40, wherein the filter stages are separated by stabilizing gain adjustment elements $G_x$, with a prior stage's input being gain adjusted by elements $(1-G_x)$, passed around elements $G_x$ and summed with the output of elements $G_x$.

43. A sigma-delta-sigma modulator as claimed in claim 40, wherein filter stages are grouped in even order cascade sets, with each pair output fed back, passed through a gain adjust element '$T_x$', and summed (spanning groups of 4 stages) or subtracted (spanning odd groups of 2 stages) with stage set input.

44. A sigma-delta-sigma modulator as claimed in claim 43, wherein the filter stages can be separated by stabilizing gain adjustment elements $G_x$, with a prior stage's input being gain adjusted by elements $(1-G_x)$, passed around elements $G_x$ and summed with the output of elements $G_x$.

45. A sigma-delta-sigma modulator as claimed in claim 40, wherein the rounding element has a multi-bit output (resolution less than modulator input resolution), a multi-bit D/A converter, a multi-bit A/D converter, and a resolution expansion element (input and output resolution equal to rounding element output and input resolution equal to rounding element output and input resolution respectively).

46. A sigma-delta-sigma modulator as claimed in claim 39, further comprising a phase 2 clocked sample and hold device receiving the held D/A converter output signal, with the resampled output passed through an analog filter to reconstruct the analog output.

47. A sigma-delta-sigma modulator for digital-to-digital signal resolution compression, comprising:
one or more filter stages in cascade, connected from the modulator input and connected to a rounding element (resolution reducer), the output of which is phase 1 clocked through a latch, then routed through a digital resolution expander and returned to each filter stage;
each filter stage comprising an input summer connected to the output and to a phase 1 clocked latch; the output of which is connected to an output summer where the expanded output is subtracted from it, the output summer connected through a phase 2 clocked latch and then through zero or more gain adjust elements and summed at the input summer; and
the modulator input connected to the input summer of the first filter stage in cascade.

48. A sigma-delta-sigma modulator as claimed in claim 47, in which the phase 1 clock to phase 2 clock time separation is such that time delay around the filter loop signal path is approximately 1 clock rate period.

49. A sigma-delta-sigma modulator as claimed in claim 48, wherein the rounding element has an output resolution less than the modulator input resolution, and a resolution expansion element (input and output resolution equal to rounding element output and input resolution respectively).

50. A sigma-delta-sigma modulator as claimed in claim 48, wherein filter stages are separated by stabilizing gain adjustment elements $G_x$, with a prior stage's input being gain adjusted by elements $(1-G_x)$, passed around elements $G_x$ and summed with the output of elements $G_x$.

51. A sigma-delta-sigma modulator as claimed in claim 48, wherein filter stages are grouped in even order cascade sets, with each pair output fed back, passed through a gain adjust element '$T_x$', and summed (spanning groups of 4 stages) or subtracted (spanning odd groups of 2 stages) with stage set input.

52. A sigma-delta-sigma modulator as claimed in claim 51, wherein filter stages are separated by stabilizing gain adjustment elements $G_x$, with a prior stage's input being gain adjusted by elements $(1-G_x)$, passed around elements $G_x$ and summed with the output of elements $G_x$.

53. A sigma-delta-sigma modulator for digital-to-analog signal conversion, comprising:
one or more filter stages in cascade, connected from the modulator input and connected to a rounding element (resolution reducer), the output of which is connected to a D/A converter, the analog output of which is phase 1 clocked through a sample and hold device, then routed through an A/D converter and then through a digital resolution expander and returned to each filter stage;
each filter stage comprising an input summer connected to the output and to a phase 1 clocked latch, the output of which is connected to an output summer where the A/D expanded output is subtracted from it, the output summer connected through a phase 2 clocked latch and then through zero or more gain adjust elements and summed at the input summer;
the modulator input connected to the output summer of the first filter stage in cascade.

54. A sigma-delta-sigma modulator as claimed in claim 53, in which the phase 1 clock to phase 2 clock time separation is such that time delay around the filter loop signal path is approximately 1 clock rate period.

55. A sigma-delta-sigma modulator as claimed in claim 54, wherein the rounding element has a single bit output, the D/A is a bipolar analog output buffer, the A/D converter is a 1 bit output comparator, and the resolution expander has a multi-bit output.

56. A sigma-delta-sigma modulator as claimed in claim 55, wherein filter stages are separated by stabilizing gain adjustment elements $G_x$, with a prior stage's input being gain adjusted by elements $(1-G_x)$, passed around elements $G_x$ and summed with the next filter stage's output summer.

57. A sigma-delta-sigma modulator as claimed in claim 54, wherein the rounding element has a multi-bit output (resolution less than modulator input resolution), a multi-bit D/A converter, a multi-bit A/D converter and a resolution expansion element (input and output resolution equal to rounding element output and input resolution respectively).

58. A sigma-delta-sigma modulator as claimed in claim 55, wherein filter stages are grouped in even order cascade sets, with each pair output fed back, passed through a gain adjust element '$T_x$', and summed (spanning groups of 4 stages) or subtracted (spanning odd groups of 2 stages) with stage set input.

59. A sigma-delta-sigma modulator as claimed in claim 58, wherein filter stages are separated by stabilizing gain adjustment elements $G_x$, with a prior stage's input being gain adjusted by elements $(1-G_x)$, passed around elements $G_x$ and summed with the next filter stage's output summer.

60. A sigma-delta-sigma modulator as claimed in claim 53, further comprising a phase 2 clocked sample and hold device receiving the held D/A converter output signal, with the resampled output passed through an analog filter to reconstruct the analog output.

61. A sigma-delta-sigma modulator for digital-to-digital signal resolution compression, comprising:
one or more filter stages in cascade, connected from the modulator input and connected to a rounding element (resolution reducer), the output of which is phase 1 clocked through a latch, then routed through a digital resolution expander and returned to each filter stage;
each filter stage comprising an input summer connected to the output and to a phase 1 clocked latch, the output of which is connected to an output summer where the expanded output is subtracted from it, the output summer connected through a phase 2 clocked latch and then through zero or more gain adjust elements and summed at the input summer; and
the modulator input connected to the output summer of the first filter stage in cascade.

62. A sigma-delta-sigma modulator as claimed in claim 61, in which the phase 1 clock to phase 2 clock time separation is such that time delay around the filter loop signal path is approximately 1 clock rate period.

63. A sigma-delta-sigma modulator as claimed in claim 62, wherein the rounding element has an output resolution less than the modulator input resolution, and a resolution expansion element (input and output resolution equal to rounding element output and input resolution respectively).

64. A sigma-delta-sigma modulator as claimed in claim 62, wherein filter stages are separated by stabilizing gain adjustment elements $G_x$, with a prior stage's input being gain adjusted by elements $(1-G_x)$, passed around elements $G_x$ and summed with the next filter stage's output summer.

65. A sigma-delta-sigma modulator as claimed in claim 62, wherein filter stages are grouped in even order cascade sets, with each pair output fed back, passed through a gain adjust element '$T_x$', and summed (spanning groups of 4 stages) or subtracted (spanning odd groups of 2 stages) with stage set input.

66. A sigma-delta-sigma modulator as claimed in claim 65, wherein filter stages are separated by stabilizing gain adjustment elements $G_x$, with a prior stage's input being gain adjusted by elements $(1-G_x)$, passed around elements $G_x$ and summed with the next filter stage's output summer.

* * * * *